United States Patent [19]
Miyake

[11] Patent Number: 6,160,611
[45] Date of Patent: Dec. 12, 2000

[54] EXPOSING APPARATUS AND METHOD

[75] Inventor: Eiichi Miyake, Amagasaki, Japan

[73] Assignee: Sanei Giken Co., Ltd., Hyogo, Japan

[21] Appl. No.: 09/196,135

[22] Filed: Nov. 20, 1998

[30] Foreign Application Priority Data

Dec. 18, 1997 [JP] Japan ................................. 9-349386
Jul. 30, 1998 [JP] Japan ................................. 10-215811

[51] Int. Cl.[7] .......................... G03B 27/42; G03B 27/54; G03F 9/00; C09K 19/00
[52] U.S. Cl. ................................. 355/53; 355/67; 430/5; 430/20
[58] Field of Search ................................. 355/50, 51, 53, 355/67, 71; 356/399–401; 430/5, 20, 22, 30, 311

[56] References Cited

U.S. PATENT DOCUMENTS

| | | | |
|---|---|---|---|
| 4,814,830 | 3/1989 | Isohata et al. | |
| 4,878,086 | 10/1989 | Isohata et al. | 355/77 |
| 5,223,719 | 6/1993 | Takahashi et al. | 250/492.2 |
| 5,464,715 | 11/1995 | Nishi et al. | 430/22 |
| 5,498,118 | 3/1996 | Nakahara | 414/416 |
| 5,666,205 | 9/1997 | Tateno et al. | 356/401 |
| 5,736,300 | 4/1998 | Mizuno et al. | 430/313 |
| 5,912,727 | 6/1999 | Kawai | 355/67 |
| 5,966,201 | 10/1999 | Shiraishi et al. | 355/53 |

FOREIGN PATENT DOCUMENTS 0 472 217 A1 2/1992 European Pat. Off. .
0 657 780 A1 6/1995 European Pat. Off. .

Primary Examiner—Russell Adams
Assistant Examiner—Hung Henry Nguyen
Attorney, Agent, or Firm—McDermott, Will & Emery

[57] ABSTRACT

According to an exposing apparatus and an exposing method of the present invention, a photomask is provided with linear patterns having their linear portions to be transferred onto a plate reduced in length. By moving and stopping photomask in one direction of plate and directing light to photomask, the linear patterns are transferred onto plate. Thus, the exposing apparatus and method are provided capable of efficiently transferring the linear patterns onto the plate by exposure using a small photomask.

23 Claims, 21 Drawing Sheets

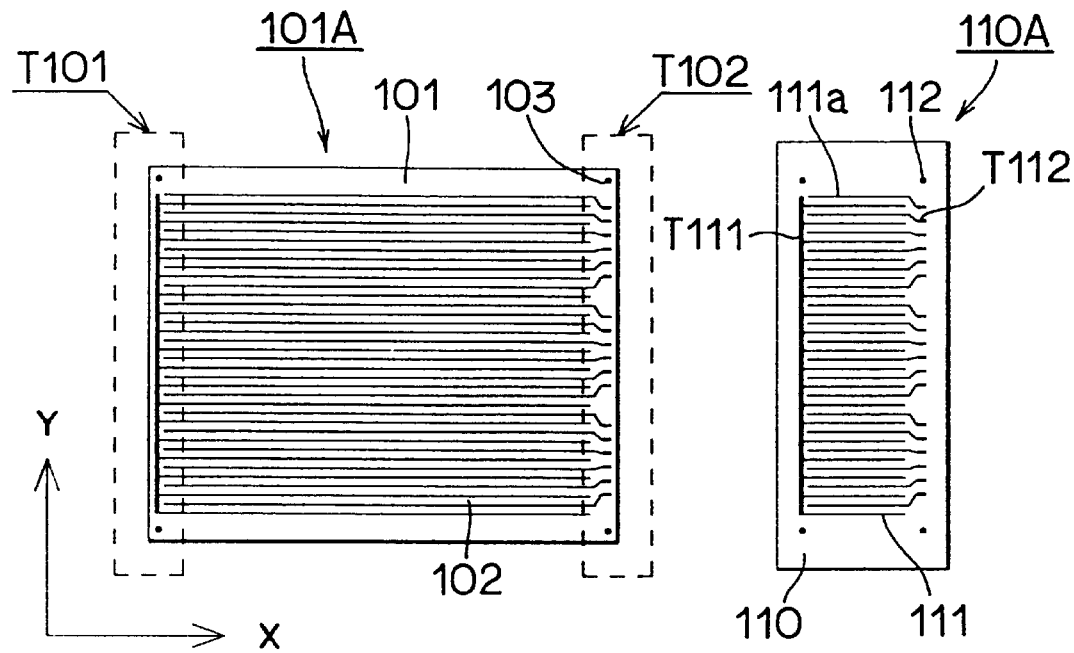
FIG. 15A
FIG. 15B
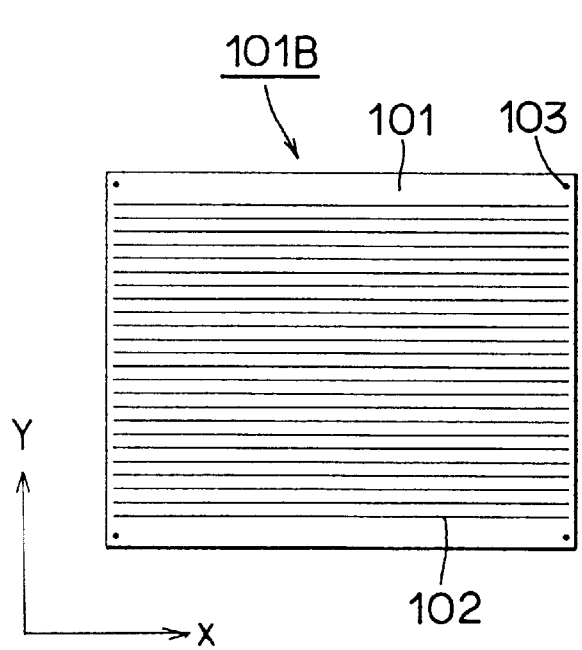
FIG. 16A
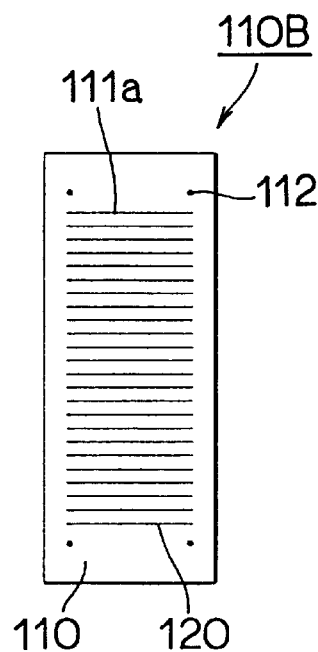
FIG. 16B

EXPOSING APPARATUS AND METHOD

BACKGROUND OF THE INVENTION

1. Field of the Invention

The present invention relates to exposing apparatuses and methods, and more particularly to an exposing apparatus and an exposing method for transferring patterns onto a plate by irradiation of light onto the plate having on its surface a layer of photosensitive material through a photomask which is positioned in the vicinity of the plate, which photomask is provided with a plurality of linear patterns in parallel or with patterns in arbitrary forms at least at one ends thereof.

2. Description of the Background Art

A glass plate for a liquid crystal or plasma display is increasingly becoming larger in size. The plate especially used for the plasma display has increased in size to achieve as large a dimension as 1 m×1.5 m.

Naturally, a photomask for exposure for forming a prescribed pattern onto such large plate must be increased in size accordingly. However, the manufacture of such large photomask to suffice the demand is often accompanied by difficulties including that in ensuring accuracy in processing and pattern drawing as well as by significant cost for material.

In addition, even if the large photomask sufficing the above mentioned requirement is manufactured, the exposing apparatus itself would accordingly become extremely larger in size, thereby requiring a large space for installation and making its operation extremely complicated. As a result, the manufacture of the large photomask and accordingly large exposing apparatus requires extremely high equipment and maintenance expenditure in total.

Further, when a foreign matter adheres on the photomask, it is directly transferred as a pattern, thereby decreasing product yield. Thus, the photomask is carefully handled to prevent the foreign matter or the like from adhering thereon.

SUMMARY OF THE INVENTION

Therefore, a first object of the present invention is to provide an exposing apparatus and an exposing method for performing an exposing process with high accuracy, which apparatus can readily be manufactured with low equipment and maintenance expenditure, even in the manufacture of an increasingly larger plate with a prescribed pattern.

A second object of the present invention is to provide an exposing apparatus and an exposing method which can be operated and performed even when a foreign matter adheres on the photomask.

In the exposing apparatus according to the present invention, patterns are transferred onto the plate by irradiation of light onto the plate having on its surface a layer of photosensitive material through a photomask which is positioned in the vicinity of the plate, which photomask is provided with a plurality of linear patterns in parallel or with patterns in arbitrary forms at least at one ends thereof. The linear patterns on the photomask have their linear portions to be transferred onto the plate reduced in length. The photomask and light irradiation device for directing light onto the plate through the photomask are relatively moved or stopped in the X and Y directions within a prescribed area including the plate, during which the patterns are sequentially transferred onto the plate by exposure.

As described above, when the photomask with pattern which have their linear portions to be transferred onto the plate reduced in length is used, corresponding reduction in size of the photomask can be achieved as compared with the conventional case where the photomask on which all of the patterns are drawn is employed. Therefore, the problems associated with accuracy and cost in the manufacture of the photomask can be solved.

In addition, such photomask allows transfer of the linear patterns onto the plate with high accuracy by sequentially transferring the patterns onto the plate by exposure while the photomask is being relatively moved or stopped with respect to the plate.

Further, as the pattern is transferred while relatively moving the photomask with respect to the plate, even when the foreign matter or the like adheres on the photomask, it is not transferred onto the plate as the pattern.

More preferably, the patterns on the photomask are divided into arbitrary portions in the direction which is orthogonal to the linear patterns to be transferred onto the plate. Thus, further reduction in the size of the photomask can be achieved as the patterns on the photomask are divided into smaller groups.

More preferably, light is directed to the patterns drawn on the photomask in the direction toward the plate through the photomask to form an image on the plate by means of an optical system interposed between the photomask and the plate.

Accordingly, the image of the patterns drawn on the photomask can be exposed and reduced in size onto the plate using for example the optical system, so that fine patterns are transferred onto the plate with high accuracy.

More preferably, the light irradiation device for transferring the patterns drawn on the photomask onto the plate is provided above a photomask moving device for moving the photomask. The light irradiation device can move along with and with respect to the photomask.

More preferably, the light irradiation device is provided outside the photomask moving device for moving the photomask such that collimation beams from the light irradiation device can be deflected by a reflection mirror to reach the photomask and the plate.

More preferably, the exposing apparatus further includes an entrance conveyer for carrying the plate from an entrance to the position for exposure, and an exit conveyer for carrying the plate from the position for exposure to an exit. The light irradiation device is provided above the surface on which the plate is carried, which is formed by the entrance and exit conveyers. More preferably, laser beam is employed as the light source of the light irradiation device.

More preferably, the photomask includes a photomask alignment mark in a prescribed position for alignment with the plate.

More preferably, the photomask further includes a photomask alignment mechanism for alignment of the photomask with the plate in the X, Y and θ directions.

More preferably, a plate holder is further provided for holding the plate, which has an alignment mechanism for alignment of the photomask with the photomask alignment mechanism in the X, Y and θ directions.

More preferably, for relative movement of the photomask and the plate in the X and Y directions, the photomask moves in both X and Y directions, whereas the plate is fixed.

More preferably, for relative movement of the photomask and the plate in the X and Y directions, the photomask moves in one of X and Y directions, whereas the plate is provided to move in the other direction.

More preferably, clearance measuring and clearance adjusting devices are further provided for maintaining a prescribed clearance between the photomask and the plate.

More preferably, a mechanism for changing the size of the area to be irradiated with light on the plate is provided.

In the exposing method according to the present invention, an exposing apparatus is used for transferring patterns on a plate by irradiation of light onto the plate having on its surface a layer of photosensitive material through a photomask positioned in the vicinity of the plate, which photomask is provided with a plurality of linear patterns in parallel or with patterns in arbitrary forms at least at one ends of the linear patterns. The linear patterns of the photomask are drawn with their linear portions to be transferred onto the plate reduced in length. The photomask and a light irradiation device for directing light onto the plate through the photomask are relatively moved or stopped in the X and Y directions within a prescribed area including the plate, during which the patterns are sequentially transferred onto the plate by exposure. An exposing process in the direction which is orthogonal to the plate provides patterns in grating form.

As described above, when the photomask with the patterns which have their linear portions to be transferred onto the plate reduced is employed, corresponding reduction in the size of the photomask can be achieved as compared with the conventional case where the photomask on which all of the patterns are drawn is employed. Therefore, the problems associated with accuracy and cost in the manufacture of the mask can be solved.

In addition, transfer of the linear patterns with high accuracy can be achieved by sequentially transferring the patterns onto the plate by exposure while the photomask is being relatively moved or stopped with respect to the plate. Further, the exposing process in the direction which is orthogonal to the plate provides the patterns in grating form.

Further, as the pattern is transferred while relatively moving the photomask with respect to the plate, even when the foreign matter or the like adheres on the photomask, it is not transferred onto the plate as the pattern.

More preferably, the patterns on the photomask are divided into arbitrary portions in the direction which is orthogonal to the linear patterns. The patterns are transferred onto the plate by exposure by suitably adjusting distances between the adjacent divided patterns.

Thus, patterns can be transferred onto the large plate by exposure with high accuracy and low cost by using the photomask further reduced in size. As a result, the present invention can sufficiently be applied to the manufacture of the plate used for the increasingly larger plasma display, for example.

According to another aspect of the present invention, an exposing apparatus is provided for transferring patterns onto a plate by irradiation of light onto the plate having on its surface a layer of photosensitive material through a photomask which is positioned in the vicinity of the plate, which photomask is provided with a plurality of linear patterns in parallel or with patterns in arbitrary forms at least at one ends thereof. The linear patterns on the photomask have their linear portions to be transferred onto the plate reduced in length. A collimation beam having a prescribed region for irradiation of light onto the plate through the photomask and a plate holder holding the plate can be moved or stopped in a direction which is parallel to the linear patterns on the photomask. The patterns in arbitrary forms at least at one ends of the linear patterns of the photomask are transferred onto the plate by irradiation of light onto the plate through the photomask while moving or stopping the collimation beam with the plate fixed in a prescribed position with respect to the photomask. The linear patterns of the photomask are transferred onto the plate through the photomask while moving the plate at an arbitrary speed with the collimation beam directed on the photomask, so that the linear patterns on the photomask having their linear portions reduced in length substantially extend to have prescribed lengths.

As described above, when the photomask with pattern which have their linear portions to be transferred onto the plate reduced in length is used, corresponding reduction in size of the photomask can be achieved as compared with the conventional case where the photomask on which all of the patterns are drawn is employed. Therefore, the problems associated with accuracy and cost in the manufacture of the photomask can be solved.

In addition, such photomask allows transfer of the linear patterns onto the plate with high accuracy by sequentially transferring the patterns onto the plate by exposure while the photomask is being relatively moved or stopped with respect to the plate.

Further, as the pattern is transferred while relatively moving the photomask with respect to the plate, even when the foreign matter or the like adheres on the photomask, it is not transferred onto the plate as the pattern.

More preferably, an area on photomask to be irradiated with the collimation beam is rectangular in shape which is determined by at least one of an optical system of a light source for directing the collimation beam and a light shielding plate having a light transmission window. A length of a side of the area to be irradiated with light which is parallel to the linear pattern of the photomask is almost the same as or shorter than that of the linear pattern. A length of a side of the area to be irradiated with light which is orthogonal to the linear pattern of the photomask is set such that the patterns in the same direction can be simultaneously transferred onto the plate.

More preferably, the photomask is provided with: a slightly moving device capable of slightly moving in a θ direction on a plane including the surface of the photomask; and a control device controlling the slightly moving device such that a direction of movement of a plate holder is parallel to the linear pattern of the photomask by moving the plate holder and measuring a distance in a direction which is almost orthogonal to the linear patterns of the photomask between one of two photomask alignment marks provided parallel to the linear patterns of the photomask and with an arbitrary distance therebetween and the linear pattern of the photomask, and one plate holder alignment mark provided in the plate holder which is guided by a straight rail and moves in parallel to the linear pattern of the photomask.

More preferably, an alignment control device is provided for aligning the photomask with the plate by moving the plate with respect to the photomask in X, Y and θ directions and simultaneously reading positions of a plurality of photomask alignment marks provided in the photomask and the plate alignment marks provided in the plate corresponding to the photomask alignment marks, and based on an amount of displacement in position of the photomask alignment mark of the photomask and the plate alignment mark, further moving the plate in the X, Y and θ directions.

According to another aspect of the present invention, an exposing method using the above described exposing apparatus is provided for forming a two or three-dimensionally combined pattern using an intended material on the plate by combining the steps of: transferring the linear pattern of the photomask onto the plate a plurality of times in a direction which is parallel to or different from the linear pattern of the photomask; forming a photosensitive layer on the plate which is optically negative or positive; and forming a thin layer by development, etching or film formation using the intended material.

According to still another aspect of the present invention, an exposing method using the above described exposing apparatus is provided including steps of: transferring a first linear pattern of the photomask onto a first photosensitive layer on the plate; forming a pattern using an intended material by development, etching or the like; making the transferred pattern on the first photosensitive layer clear at least by development; forming a second photosensitive layer on the first photosensitive layer having the transferred pattern which has become clear; transferring a second linear pattern orthogonal to the first linear pattern onto the second photosensitive layer by exposure; and making the transferred pattern on the second photosensitive layer by development for forming patterns in grating forms or a number of rectangular patterns.

As described above, when the photomask with pattern which have their linear portions to be transferred onto the plate reduced in length is used, corresponding reduction in size of the photomask can be achieved as compared with the conventional case where the photomask on which all of the patterns are drawn is employed. Therefore, the problems associated with accuracy and cost in the manufacture of the photomask can be solved.

In addition, such photomask allows transfer of the linear patterns onto the plate with high accuracy by sequentially transferring the patterns onto the plate by exposure while the photomask is being relatively moved or stopped with respect to the plate.

Further, as the pattern is transferred while relatively moving the photomask with respect to the plate, even when the foreign matter or the like adheres on the photomask, it is not transferred onto the plate as the pattern.

According to another aspect of the present invention, an exposing apparatus is provided for positioning a photomask with a pattern in a prescribed shape in the vicinity of a plate having on its surface a layer of photosensitive material and transferring the pattern onto the plate by irradiation of light onto the plate through the photomask. The photomask and a light irradiation device for directing light onto the plate through the photomask can be relatively moved or stopped in a prescribed area including the plate in X and Y directions. The pattern to be transferred onto the plate is sequentially transferred onto the plate by exposure while the photomask is moved or stopped with respect to the plate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15A is a plan view shown in conjunction with a pattern to be transferred onto a plate according to a second embodiment of the present invention, and FIG. 15B is a plan view showing a photomask used for transferring the pattern shown in FIG. 15A.

FIGS. 16A, 17A and 18A are plan views shown in conjunction with another patterns to be transferred onto the plate according to the second embodiment of the present invention, and FIGS. 16B, 17B and 18B are plan views showing photomasks used for transferring the patterns shown in FIGS. 16A, 17A and 18A.

DESCRIPTION OF THE PREFERRED EMBODIMENTS

Figure 1:
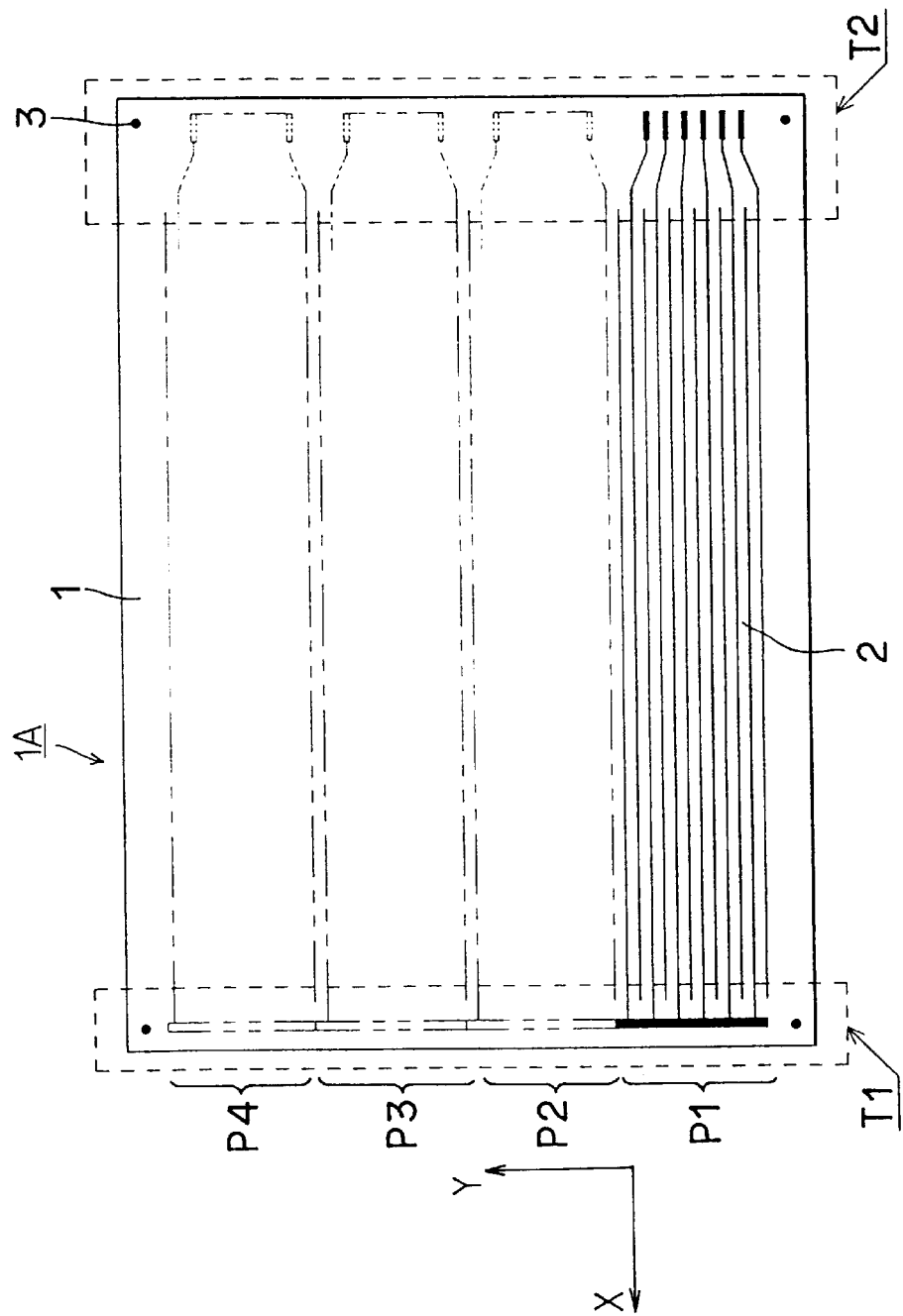
FIG. 1 is a plan view shown in conjunction with a pattern to be transferred onto a glass plate according to a first embodiment of the present invention.

The embodiments of an exposing apparatus and an exposing method according to the present invention will now be described with reference to the drawings.
First Embodiment Referring first to FIG. 1, a glass plate for a plasma display is exemplified. On a plate 1A, a glass plate 1 and pattern 2 are provided, which pattern 2 having a plurality of patterns linearly extending in parallel in one direction (in the X direction in the drawing, which is hereinafter referred to as an X direction) of glass plate 1 on the surface thereof.

Terminal patterns T1 and T2 in prescribed forms are formed at both ends of pattern 2. It is noted that the terminal patterns may be formed at only one ends of the pattern. Further, alignment marks 3 for the plate are formed in four corners of glass plate 1 used in aligning plate 1A and the photomask for exposure in alignment.

Pattern 2 includes divided patterns P1, P2, P3 and P4 which are equally divided from pattern 2 into four portions in the direction which is orthogonal to the X direction (in the direction denoted by Y in the drawing, which will be hereinafter referred to as a Y direction). In other words, pattern 2 is formed of divided patterns P1 to P4 of identical patterns.

Figure 2:
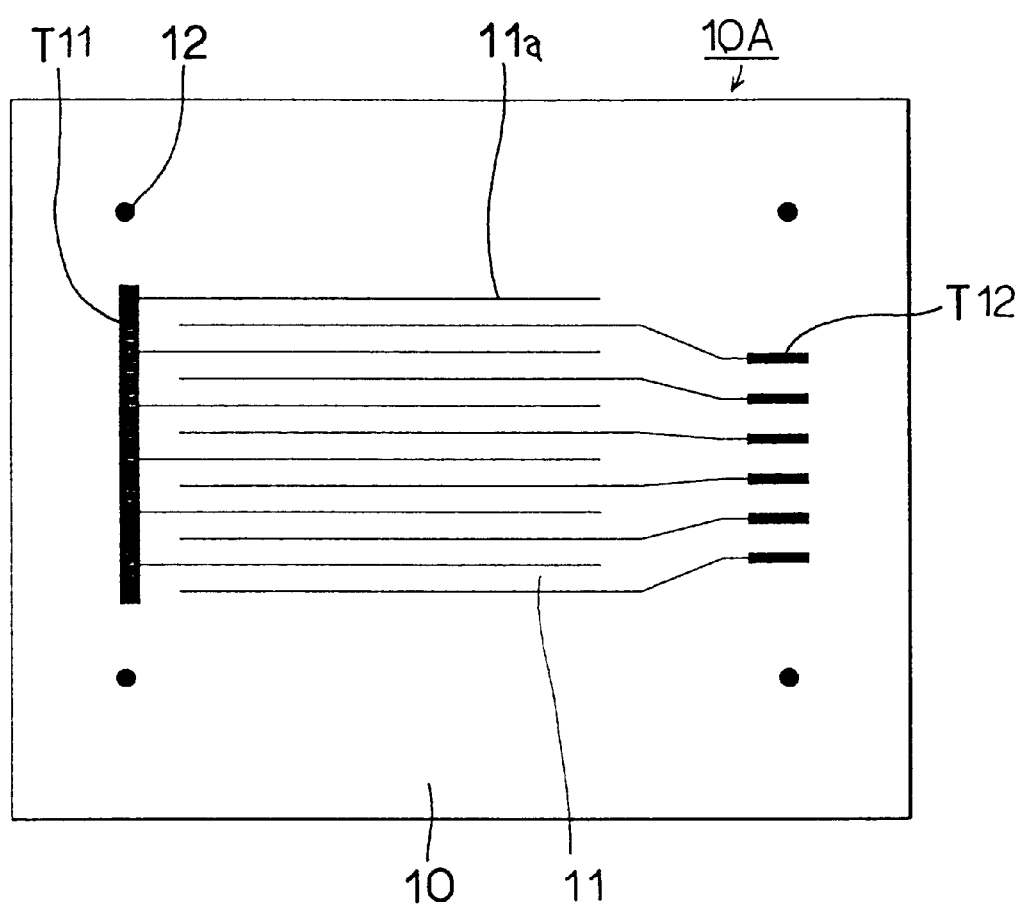
FIG. 2 is a plan view showing a photomask used for transferring the pattern shown in FIG. 1.

Referring now to FIG. 2, a photomask 10A for transferring pattern 2 onto plate 1A by exposure will be described.

Photomask 10A includes a pattern 11 having a linear portion 11a which corresponds to one of linear portions of divided patterns P1 to P4 of pattern 2 reduced in length in a longitudinal direction to be transferred onto plate 1A on a transparent glass plate 10, and terminal patterns T11 and T12 corresponding to terminal patterns T1 and T2 at its ends. Further, alignment marks 12 for the photomask are provided in four corners of glass plate 10 for alignment with plate 1A.

Now, the exposing method for transferring pattern 2 on the entire surface of plate 1A by exposure using the above mentioned photomask 10A shown in FIG. 2 will be described with reference to FIGS. 3 to 8.

Figure 3:
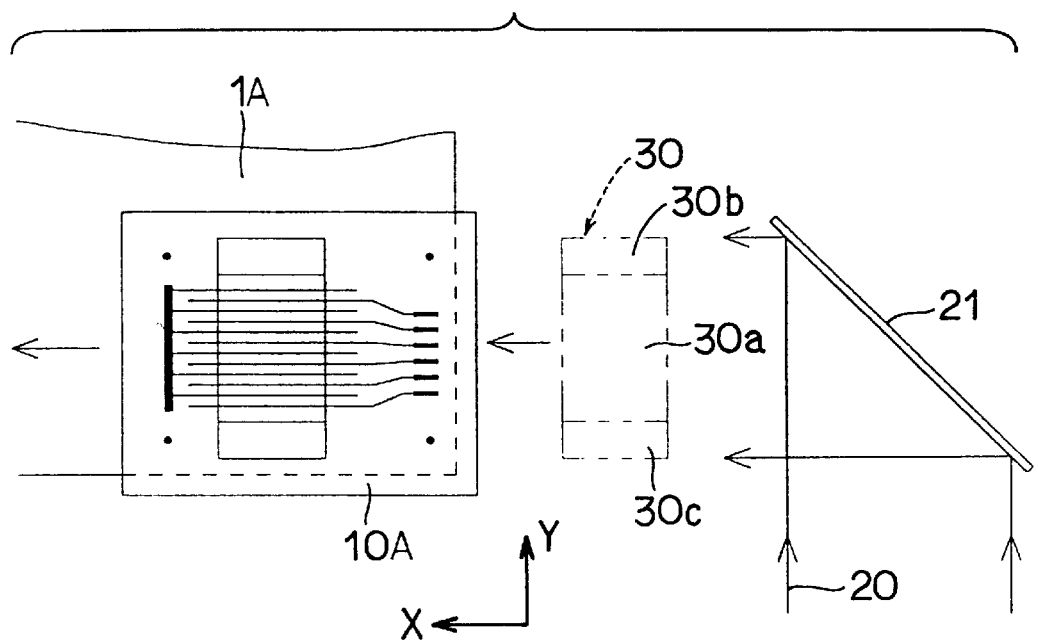
FIG. 3 is a plan view used for describing a basic principle of an exposing method according to the first embodiment of the present invention.
Figure 4:
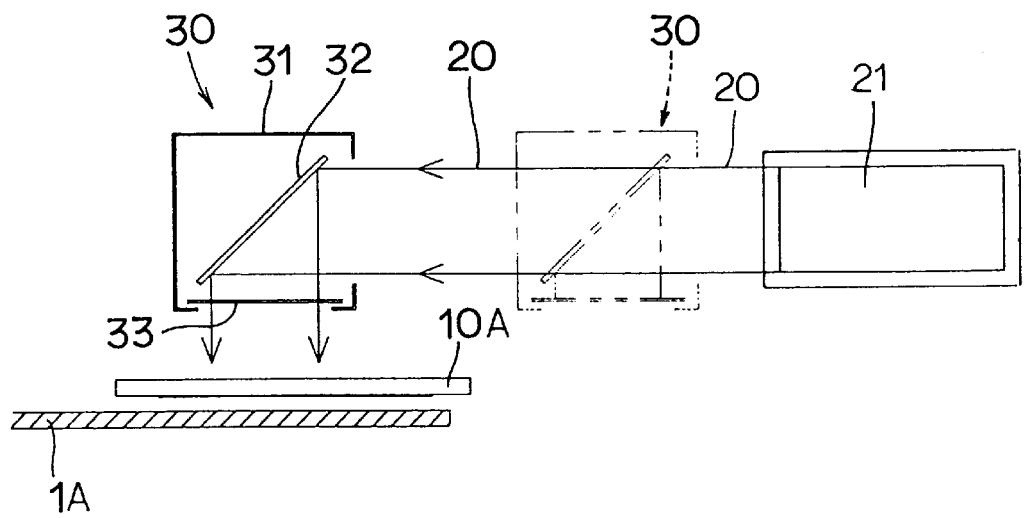
FIG. 4 is a side view used for describing the basic principle of the exposing method according to the first embodiment of the present invention.

Referring first to FIGS. 3 and 4, the basic exposing method will be described. It is noted that FIG. 3 is a top view showing plate 1A having on its surface photomask 10A and a layer of photosensitive material, and FIG. 4 is a side view thereof.

Referring to the drawings, photomask 10A is arranged in a prescribed position at one corner of plate 1A, showing a starting position for transferring pattern 11 onto the plate.

Irradiation light (collimation light) 20, which is used for transferring pattern 11 provided on photomask 10A onto plate 1A, is emanated from a light source (not shown in the drawing) arranged outside plate 1A horizontally and orthogonally to linear portion 11a of pattern 11. Irradiation light (collimation light) 20 emanated from the light source is reflected by reflection mirrors 21 and 32, transmitted into photomask 10A from thereabove and directed onto plate 1A, as shown in FIGS. 3 and 4. It is noted that reflection mirror 32 is covered with a protection cover 31 and, the area of photomask 10 to be irradiated with irradiation light 20 can be adjusted by opening and closing shutters 30a, 30b and 30c provided for protection cover 31.

It is noted that reflection mirror 32, protection cover 31 and shutters 30a to 30c comprise a first light irradiation device 30.

Photomask 10A is provided to maintain a small clearance (which is between 0.05 mm and 0.5 mm) with respect to plate 1A.

Photomask 10A and irradiation light 20 have a mechanism moving in the X and Y directions (whose detailed description will be later provided). Referring to FIGS. 5 to 8, a method of transferring pattern 11 on photomask 10A onto plate 1A with such mechanism will be described.

Figure 5:
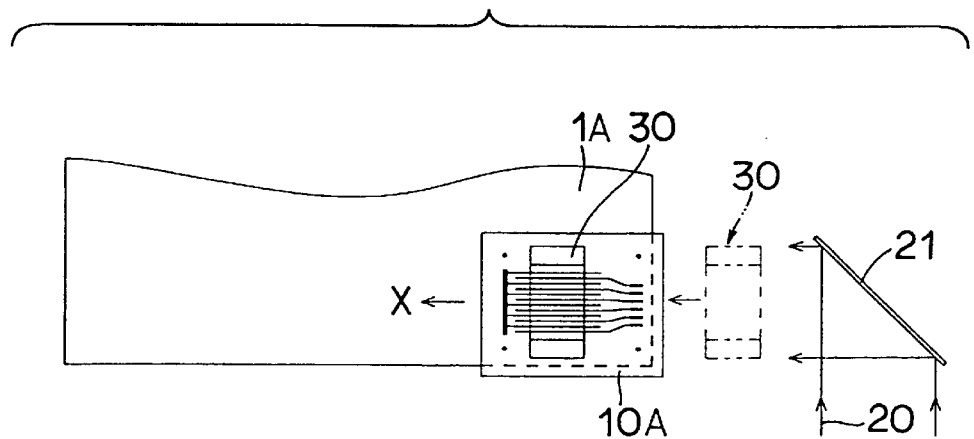
FIGS. 5 to 8 are views used for describing the basic principle of the exposing method according to the first embodiment of the present invention.

Referring now to FIG. 5, by moving first light irradiation device 30 above terminal pattern T12 on photomask 10A with photomask 10A fixed, plate 1A is irradiated with light through photomask 10A, so that terminal pattern T12 is transferred onto plate 1A.

Figure 6:
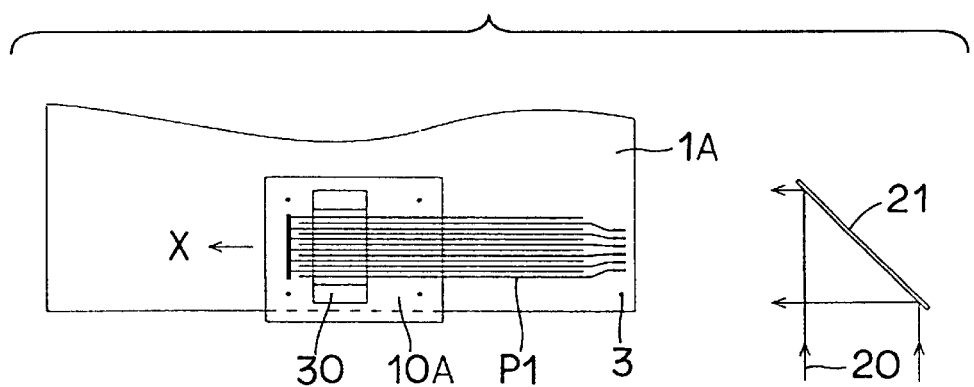
Figure 8:
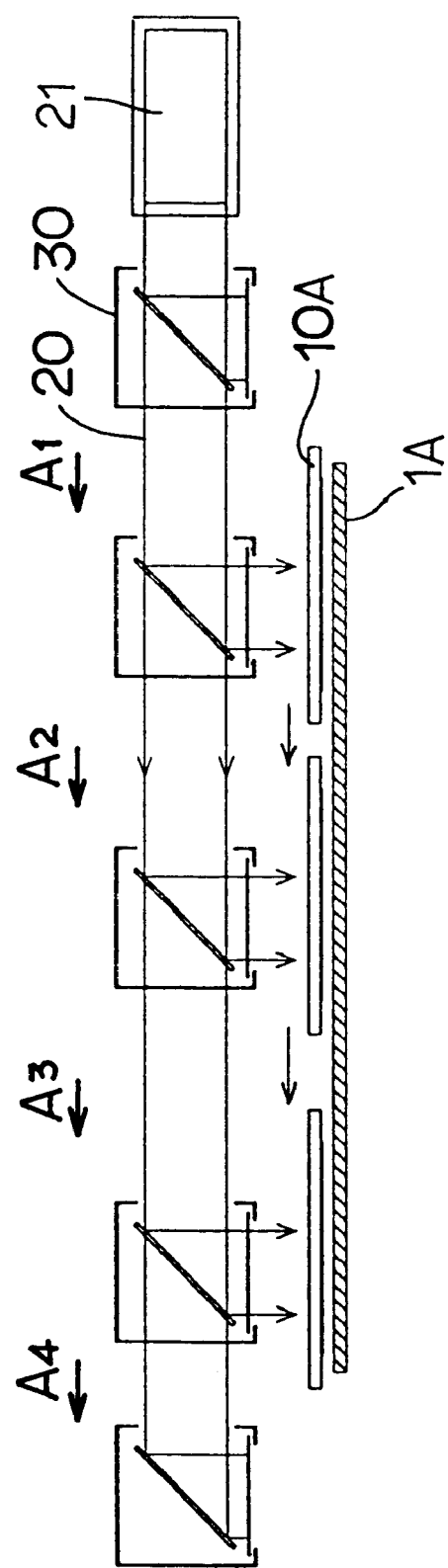

Thereafter, while further moving first light irradiation device 30, when first light irradiation device 30 is positioned above the middle portion of pattern 11 on photomask 10A, photomask 10A is moved in the X direction at the same speed as that for first light irradiation device 30 to transfer the linear portion of pattern 2 onto plate 1A, as shown in FIG. 6 (with reference to arrows A1 to A3 in FIG. 8).

Figure 7:
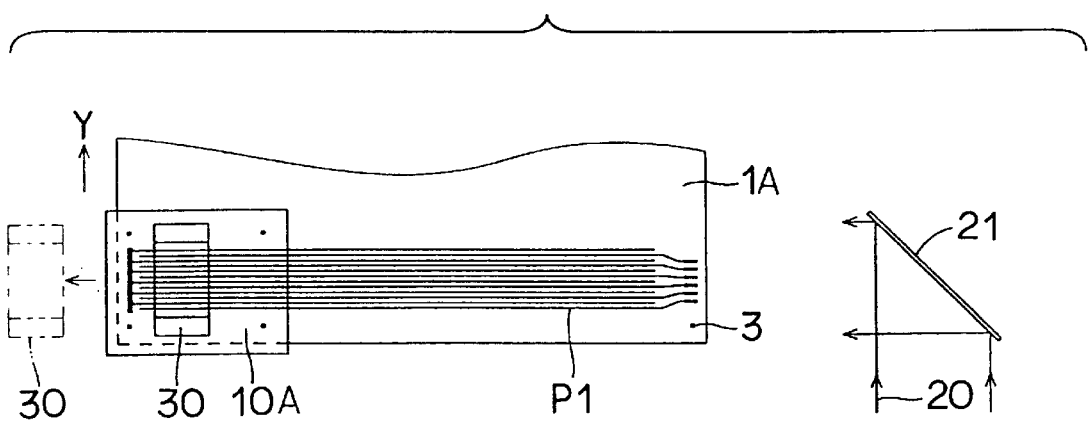

Referring now to FIG. 7, after the transfer of the linear portion of pattern 2 onto plate 1A is completed, while further moving first light irradiation device 30 above terminal pattern T11 on photomask 10A with photomask 10A fixed, plate 1A is irradiated with light through photomask 10A so that terminal pattern T11 is transferred onto plate 1A. Thereafter, first light irradiation device 30 is moved outside plate 1A and stopped.

Through the operation hereinbefore, divided pattern P1 for plate 1A shown in FIG. 1 is transferred onto plate 1A.

Then, photomask 10A and first light irradiation device 30 are relatively moved in the Y direction by one divided patterns and also moved in the −X direction which is opposite to the direction shown in FIGS. 5 to 7. By performing the exposing process shown in FIGS. 5 to 7 in the opposite direction, next divided pattern P2 is transferred onto plate 1A. Repeating the operation to transfer divided patterns P3 and P4 by exposure provides pattern 2 formed on the entire surface of plate 1A as shown in FIG. 1.

It is noted that, during the exposing process of divided pattern P1, shutters 30a and 30c are in an open state and shutter 30b is in a closed state, so that alignment marks 3 are transferred onto the four corners of plate 1A. On the other hand, during the exposing process of divided patterns P2 and P3, only shutter 30a is in the open state and shutters 30b and 30c are in the closed state as alignment marks 3 need not be transferred.

Further, during the exposing process of divided pattern P4, shutters 30a and 30b are in the open state and shutter 30c is in the closed state. It is noted that FIG. 8 is a side view showing the operation of first light irradiation device 30 shown in FIGS. 5 to 7.

Figure 9:
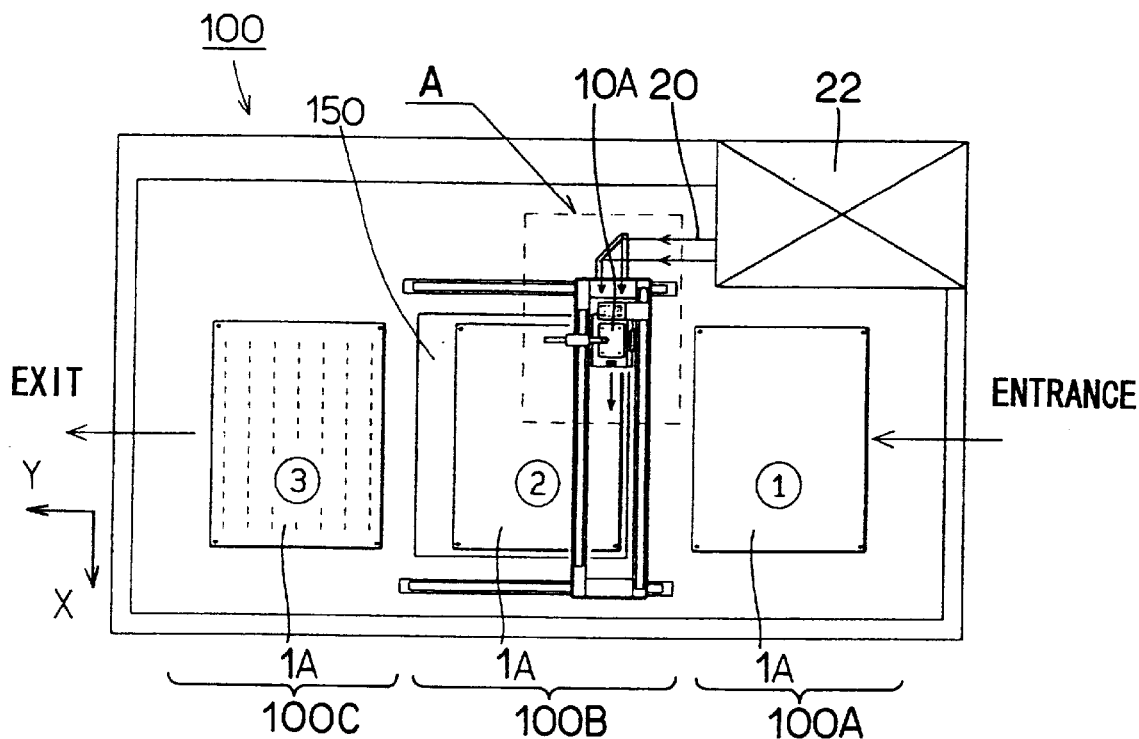
FIG. 9 is a plan view showing an exposing apparatus for performing the exposing method according to the first embodiment of the present invention.
Figure 10:
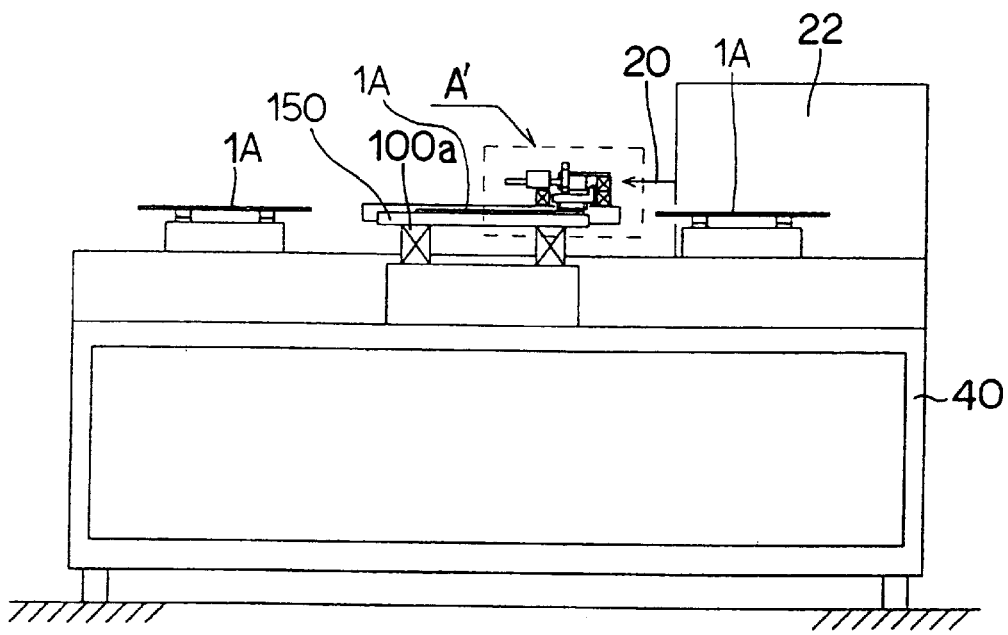
FIG. 10 is a side view showing the exposing apparatus for performing the exposing method according to the first embodiment of the present invention.
Figure 11:
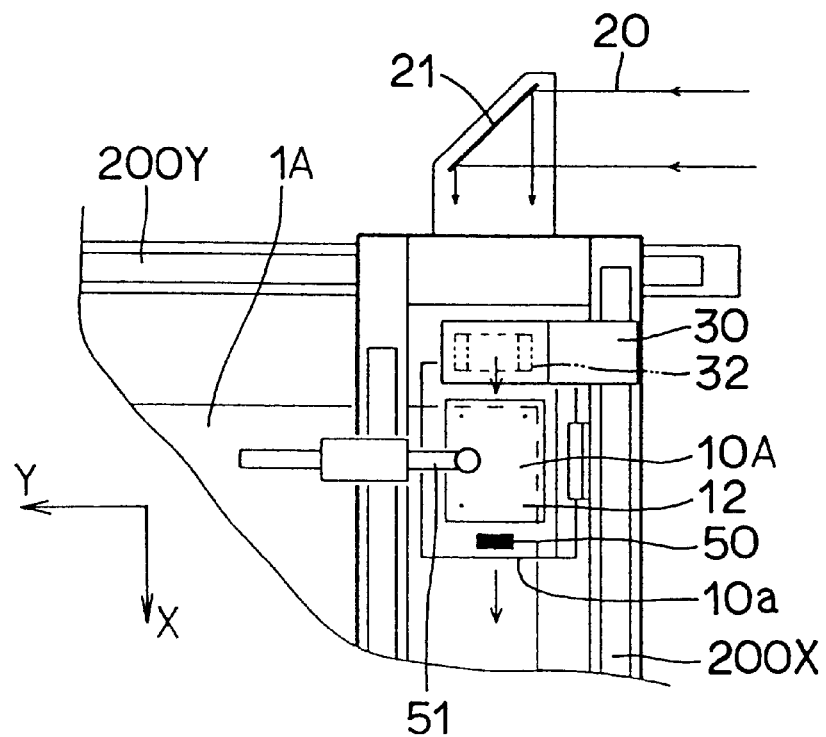
FIG. 11 is a partially enlarged view showing a portion denoted by A in FIG. 9.
Figure 12:
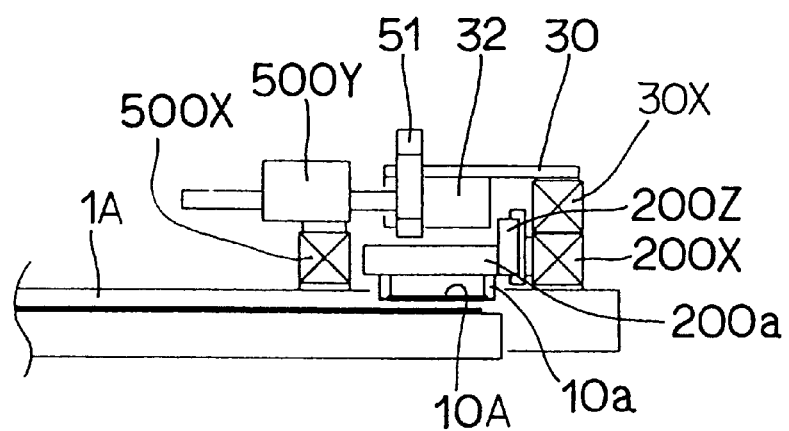
FIG. 12 is a partially enlarged view showing a portion denoted by A' in FIG. 10.

Now, an exposing apparatus for implementing the above mentioned exposing method will be described with reference to FIGS. 9 to 12. FIG. 9 is a top view of an exposing apparatus 100, FIG. 10 is a side view thereof, FIG. 11 is a diagram showing in enlargement a region denoted by A in FIG. 9, and FIG. 12 is a diagram showing in enlargement a region denoted by A in FIG. 10.

Referring first to FIGS. 9 to 12, exposing apparatus 100 according to the present embodiment includes an entrance station 100A for carrying plate 1A to exposing apparatus 100, an exposing station 100B for performing the exposing process for plate 1A and an exit station 100C for carrying plate 1A outside exposing apparatus 100. While an exit mechanism for plate 1A in each of stations 100A to 100C is not described in detail, a roller conveyer or a carrying mechanism using a plate carrying fork and a plate lift pin or the like may generally be employed.

In addition, exposing station 100B is provided with a first light irradiation device 30 having reflection mirrors 21 and 32 which are movable in the X and Y directions above plate 1A. Further, a photomask frame 10a for moving photomask 10A in the X and Y directions and a photomask X direction driving device 200X and a photomask Y direction driving device 200Y for moving photomask frame 10a in the X and Y directions are provided.

In addition, on photomask driving device 200X, a driving device 30X for driving first light irradiation device 30 in the X direction is provided. It is noted that photomask driving device 200Y is also used as a device for moving first light irradiation device 30 in the Y direction.

Provided between photomask frame 10a and photomask driving device 200X are a photomask XYθ slightly driving device 200a for fine adjusting the position of photomask 10A in the X, Y and θ directions, and a photomask Z direction driving device 200Z for vertically moving photomask frame 10a with respect to plate 1A for adjusting a distance between photomask 10a and plate 1A.

Photomask driving device 200Y further includes a CCD camera 51 for reading photomask alignment marks 12 on photomask 10A and plate alignment marks 3 on plate 1A. Camera driving devices 500X and 500Y for driving camera in the X and Y directions, respectively, are attached to CCD camera 51.

A plate YXθ fine adjusting device 100a is provided between a plate holder 150 at exposing station 100B and a frame 40 on which plate holder 150 is placed. Frame 40 is provided with a light source 22 for directing collimation light 20 to exposing station 100B. It is noted that a sensor 50 for sensing the distance between plate 1A and photomask 10A is attached to photomask frame 10a.

The operation of exposing apparatus 100 having the above mentioned structure will now be described.

Referring first to FIG. 9, plate 1A carried from the entrance is placed on entrance station 10A, and carried to exposing station 100B after alignment.

Then, at exposing station 100B, plate 1A is fixed to plate holder 150 by vacuum suction. At the time, photomask 10A is kept in the position in which corresponding alignment marks on photomask 10A and plate 1A almost match at the upper right corner of plate 1A.

At the time, the position of photomask 10A is adjusted using photomask XYθ slightly driving device 200a and photomask driving devices 200X and 200Y so that the pattern drawn on photomask 10A is accurately aligned in the X and Y directions of photomask driving devices 200X and 200Y.

Figure 13:
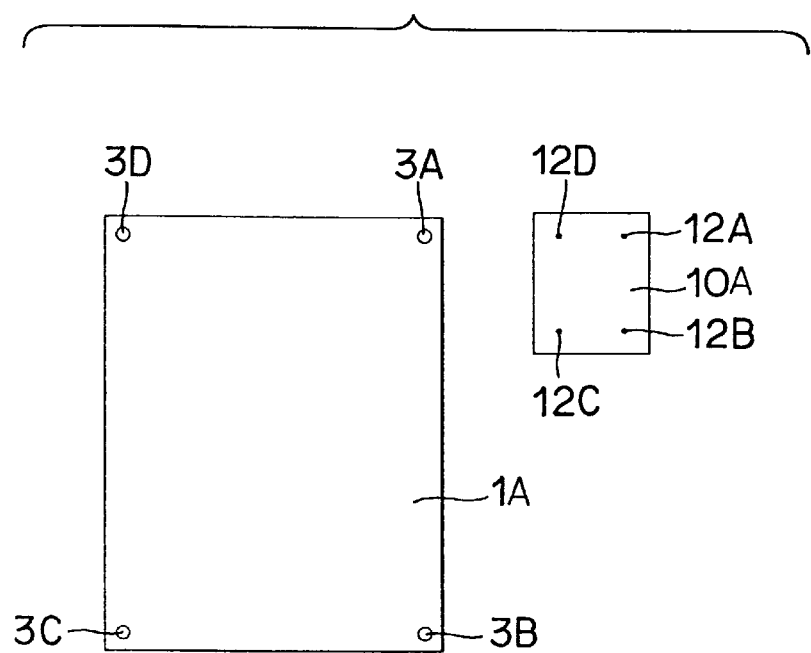
FIGS. 13 and 14 are first and second diagrams shown in conjunction with alignment of the photomask and the plate according to the first embodiment.
Figure 14:
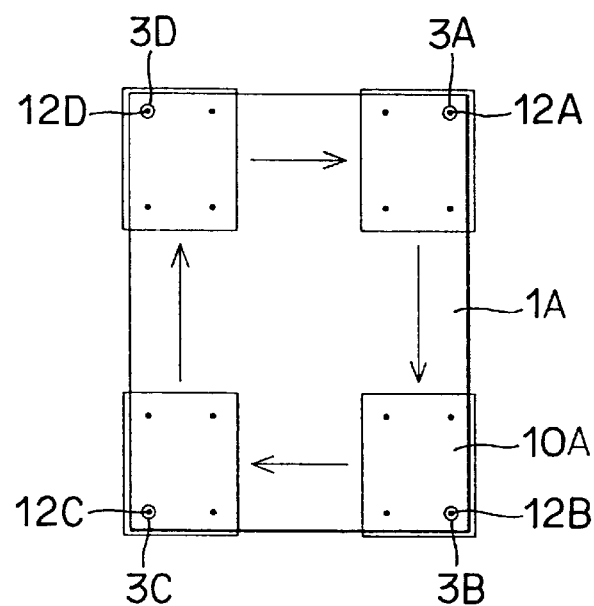

Thereafter, as shown in FIGS. 13 and 14, photomask alignment marks 12A to 12D on photomask 10A and plate alignment marks 3A to 3D on plate 1A are aligned.

In the alignment, as shown in FIG. 14, corresponding alignment marks on photomask 10A and plate 1A are aligned at each corner of plate 1A by moving CCD camera 51 and photomask 10A. Thereby, the position of the alignment marks is read and the displacement in position is calculated. Based on the result, the plate 1A is aligned in the X, Y and θ directions using plate XYθ slightly driving device 100a.

After the alignment of photomask 10A with plate 1A is completed, photomask 10A is placed back in the position in which alignment marks 3A on plate 1A and photomask alignment marks 12A on photomask 10A are aligned, that is, the starting position of the exposing process.

Further, first light irradiation device 30 and photomask 10A are moved in the X direction at the same speed when first light irradiation device 30 comes above the middle portion of linear portion 11a of pattern 11 on photomask 1A. Thereafter, only photomask 10A is stopped in the position in which photomask alignment mark 12B on photomask 10A and plate alignment mark 3B on plate 1A are aligned, and first light irradiation device 30 is kept on moving until it comes outside plate 1A.

After photomask 10A is moved in the Y direction by a prescribed pitch, the exposing process is performed for plate 1A using again photomask 10A through the process similar to that described above.

It is noted that the above mentioned photomask 10A is provided with the pattern divided into four portions in the Y direction, so that the pitch between the adjacent patterns can be adjusted by suitably controlling the amount of photomask 10A moved in the Y direction by photomask driving device 200Y.

Thereafter, as a final step, the above described operation is performed until photomask alignment mark 12C on photomask 10A and plate alignment mark 3C on plate 1A or photomask alignment mark 12D and plate alignment mark 3D are aligned, so that the pattern is transferred onto plate 1A using photomask 10A.

It is noted that in the above mentioned series of exposing processes, preferably, the distance between photomask 10a and plate 1A is always sensored by a distance sensor 50 (shown in FIG. 11) attached to photomask frame 10a and, based on the resulting data, photomask driving device 200Z is automatically controlled to make the distance constant.

Plate 1A for which the exposing process is completed at exposing station 100B would be carried out of the apparatus from the exit for a next step after it is moved to exit station 100C.

It is noted that the amount to be shifted in the Y direction can slightly be controlled, or photomask 10A can manually or. automatically be changed to employ a photomask having a pattern with a slightly different pitch so as to cope with any extension or contraction of plate 1A due to other processing treatment for plate 1A.

In addition, a plurality of different patterns may be drawn onto a single photomask so that the patterns are separately transferred onto the plate by exposure.

When the patterns formed at edge portions of plate 1A are different, photomasks corresponding to the patterns are employed for the exposing process.

In the above mentioned embodiments, although four alignment marks are provided on each of photomask 10A and plate 1A, any number, but not smaller than two, of alignment marks may be employed to achieve similar function and effect.

In addition, while the above mentioned plate 1A is used as a single product, a plurality of products may be manufactured by dividing a single plate into portions.

Further, as another application, after the linear patterns are formed in the X direction of the plate, the plate can be rotated by 90° for a similar exposing process to provide a pattern in grating form on the plate.

A laser light source may also be used as the light source. Further, although in the above mentioned embodiments, the light source is externally provided for emanating collimation light, which is directed toward the photomask using the reflection mirror, a light source device may be provided above the photomask and moved along with the photomask.

When large space is required for the light source, the light source device is provided above the apparatus to save space, thereby avoiding increase in size of the apparatus when viewed from above.

In the above mentioned embodiments, only the photomask can be moved in the X and Y directions with respect to the plate. However, the above mentioned exposing method can be implemented as long as the photomask and the plate are relatively moved in the X and Y directions, and therefore another structure may be employed in which one of the plate and the photomask is moved in the X direction and the other in the Y direction.

Second Embodiment

Now, a plate 101A and a photomask 110A of a plasma display according to the present embodiment will be described with reference to FIGS. 15A and 15B.

First, referring to FIG. 15A, plate 101A includes a glass plate 101 and is provided on its surface with a pattern 102 having a plurality of linear patterns in parallel in an X direction of glass plate 101.

At both ends of pattern 102, terminal patterns T101 and T102 are formed which are both in prescribed forms. It is noted that the terminal pattern may be formed only at one end. Further, alignment marks for the plate 103 are formed at four corners of glass plate 101 for exposure in alignment of plate 101A and the photomask.

Next, referring to FIG. 15B, photomask 110A for transferring pattern 102 onto glass plate 101 by exposure will be described.

Photomask 110A has a pattern 111 on a transparent glass plate 110. Pattern 111 includes a linear pattern 111a which is obtained by reducing the length of linear portion of pattern 102 to be transferred onto plate 101, and terminal patterns T11 and T112 corresponding to terminal patterns T101 and T102. Further, alignment marks for the photomask 112 are formed at four corners of glass plate 110 for alignment of plate 101A.

It is noted that as modifications of plate 101A and photomask 110A, plate 101B without terminal patterns T101 and T102 as shown in FIG. 16A and photomask 110B without terminal patterns T1 and T112 as shown in FIG. 16B can be used.

Figure 17A:
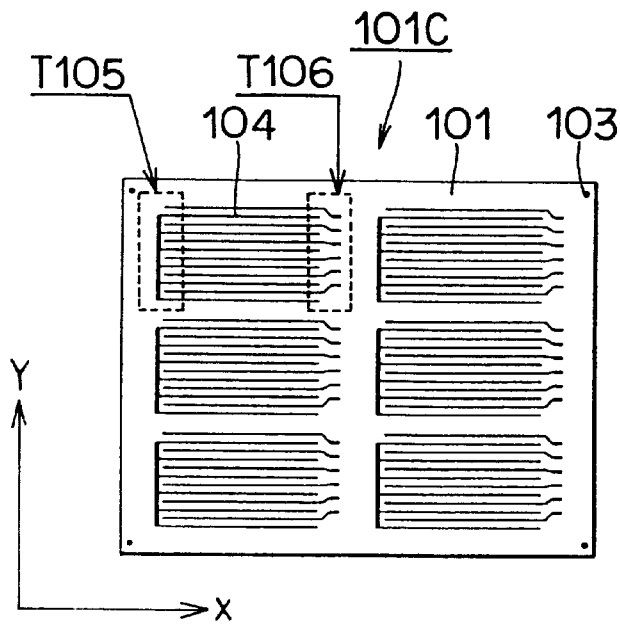
Figure 17B:
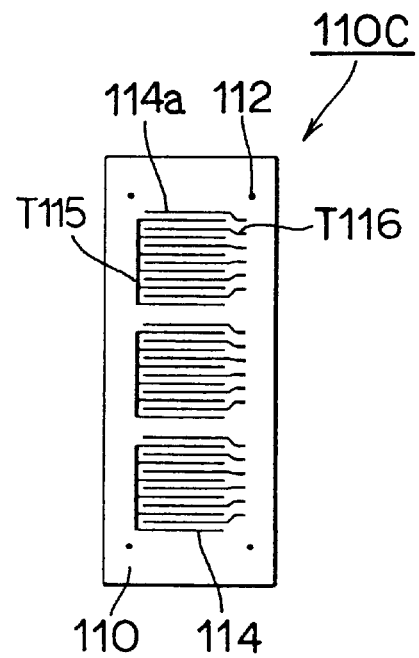

Further, as modifications of plate 101A and photomask 110A, a plate 101C and a photomask 110C may be used as shown in FIGS. 17A and 17B.

Plate 101C includes glass plate 101 which has on its surface patterns 104 in parallel in the X direction of glass plate 101, two in the X direction and three in the Y direction, that is, six in total. Terminal patterns T105 and T106 in prescribed forms are provided at both ends of each of patterns 104.

In addition, photomask 110C has on a transparent glass plate 110 three patterns 114 in the Y direction, which includes a linear portion 114a which is obtained by reducing the length of the linear portion of pattern 104 to be transferred onto plate 101C, and terminal patterns T115 and T116 corresponding to terminal patterns T105 and T106.

Figure 18A:
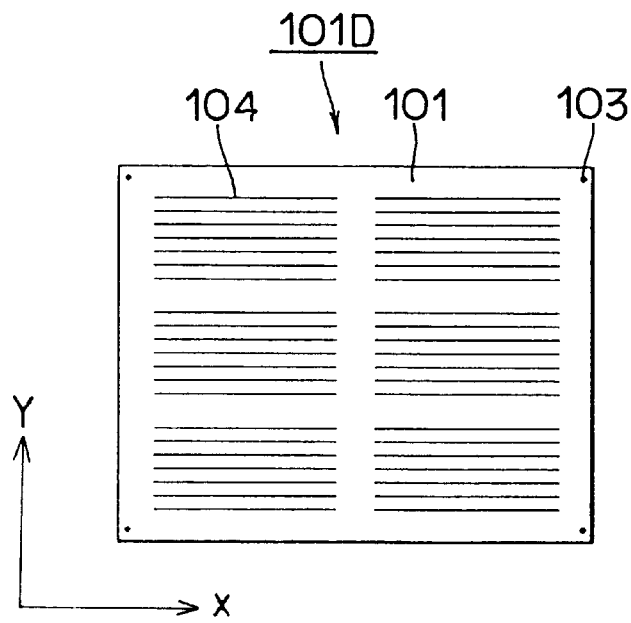
Figure 18B:
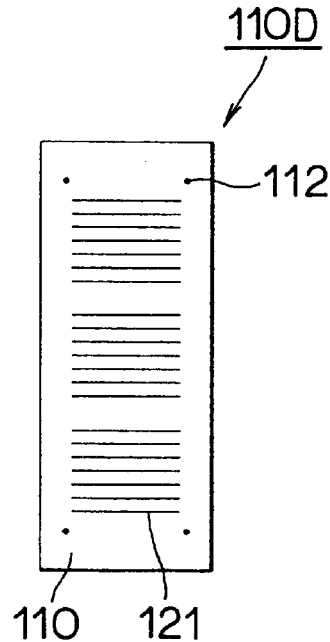

Further, as modifications of plate 101C and photomask 110C, plate 101D without terminal patterns T105 and T106 as shown in FIG. 18A and photomask 110D without terminal patterns T115 and T116 as shown in FIG. 18B can be used.

Next, an exposing method for transferring pattern 111 onto the entire surface of glass plate 101 by exposure using the above mentioned photomask 110A shown in FIG. 15B will be described with reference to FIGS. 19A, 20A, 21A and FIGS. 19B, 20B, 21B, which are respectively plan and side views.

Figure 19A:
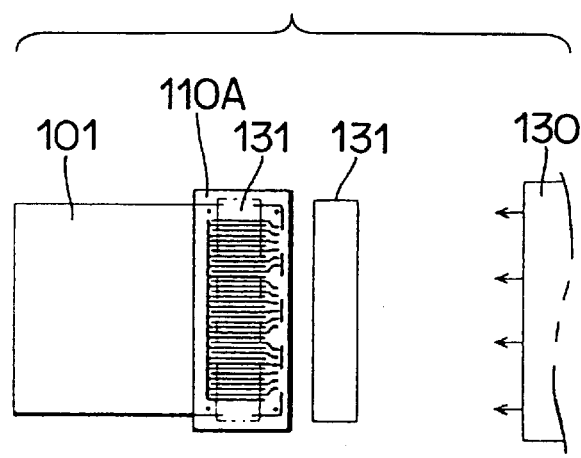
FIGS. 19A–19C are first diagrams used for describing an exposing method according to the second embodiment of the present invention.
Figure 19B:
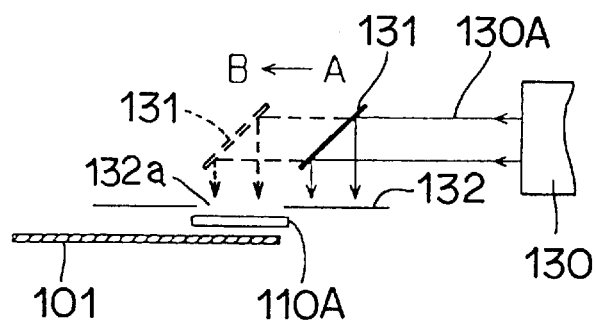

Referring first to FIGS. 19A and 19B, photomask 110A is arranged in a prescribed position at one end of glass plate 101, showing a starting position for transferring pattern 111 onto the plate.

A collimation beam 130A, which is used for transferring pattern 111 on photomask 110A onto glass plate 101, is directed from a light source (later described) positioned outside glass plate 101 horizontally and in parallel to linear pattern 111a of pattern 111.

Collimation beam 130A directed from the light source is reflected by a planar mirror 131 and, after passing through a light shielding plate 132, transmitted through photomask 110A from above toward glass plate 101. It is noted that an area to be irradiated with collimation beam 130A can be determined by an optical system on the side of the light source for directing collimation beam 130 or by an opening 132a of light shielding plate 132.

Further, a length of a side of the area to be irradiated with collimation beam 130A which is parallel to linear pattern 111a of photomask 110A is almost the same as or shorter than that of the linear pattern. A length of a side of the area to be irradiated with collimation beam 130A which is orthogonal to linear pattern 111a of photomask 110A is set such that patterns 111a arranged in the same direction are simultaneously transferred.

Photomask 110A is provided to have a small clearance (0.05–0.5 mm) with respect to glass plate 101 to avoid contact therewith as in the case of the above described first embodiment.

Planar mirror 131 for reflecting collimation beam 130A and glass plate 101 have mechanisms which move in the X direction (which will later be described in detail).

First, referring to FIGS. 19A and 19B, terminal pattern T112 is transferred onto glass plate 101 by directing light onto glass plate 101 through photomask 110A while moving planar mirror 131 above terminal pattern T112 of photomask 110A with glass plate 101 fixed.

At the time, the area to be irradiated with collimation beam 130A is determined by the optical system on the side of the light source for directing collimation beam 130A, and therefore light shielding plate 132 is used for preventing irradiation of collimation beam 130A onto an area which needs not be irradiated with light.

Figure 20A:
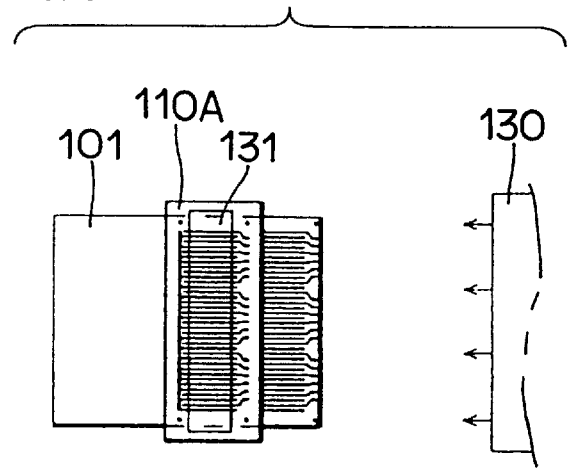
FIGS. 20A–20C are second diagrams used for describing the exposing method according to the second embodiment of the present invention.
Figure 20B:
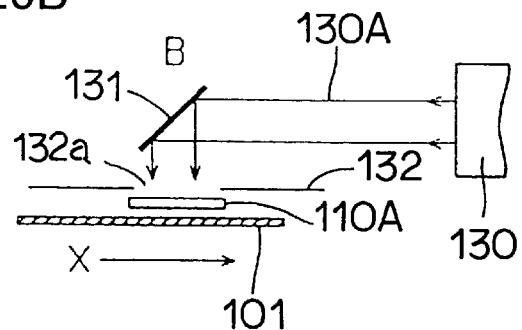

Referring now to FIGS. 20A and 20B, linear pattern 111a of pattern 111 of photomask 110A is transferred onto glass plate 101 while moving only glass plate 101 in the X direction with planar mirror 131 fixed above a central portion of pattern 111a of photomask 110A.

Figure 21A:
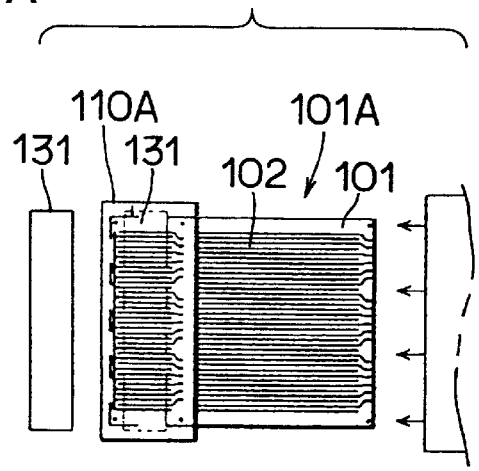
FIGS. 21A–21C are third diagrams used for describing the exposing method according to the second embodiment of the present invention.
Figure 21B:
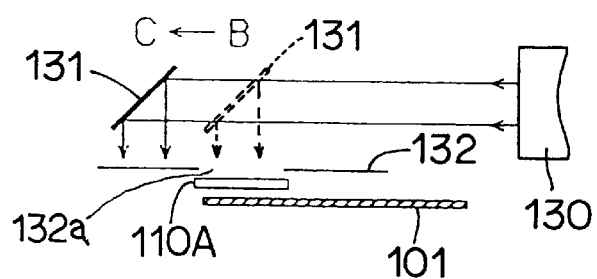

Referring to FIGS. 21A and 21B, after linear pattern 111a of pattern 111 is transferred onto glass plate 101, terminal pattern T111 is transferred onto plate 110A by directing light onto glass plate 101 through photomask 110A with glass plate 101 fixed in the position where terminal pattern T11 is transferred onto the plate in a prescribed position. Thereafter, planar mirror 131 is further moved in the X direction and stopped.

Figure 19C:
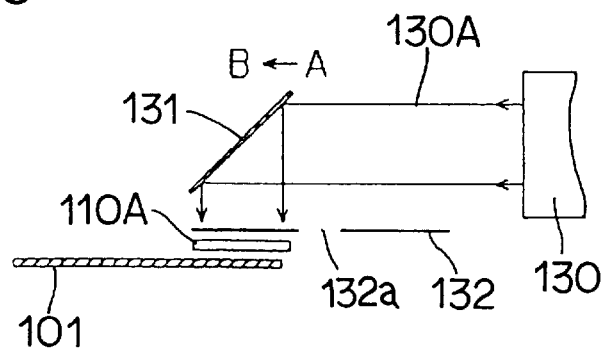
Figure 20C:
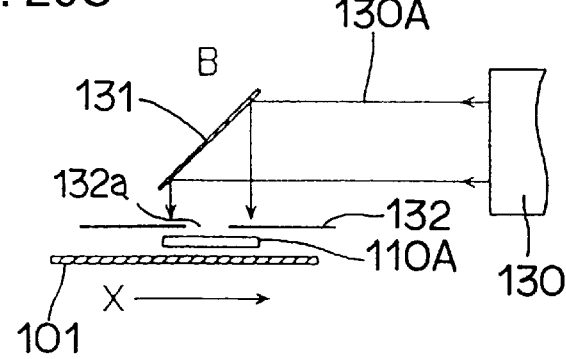
Figure 21C:
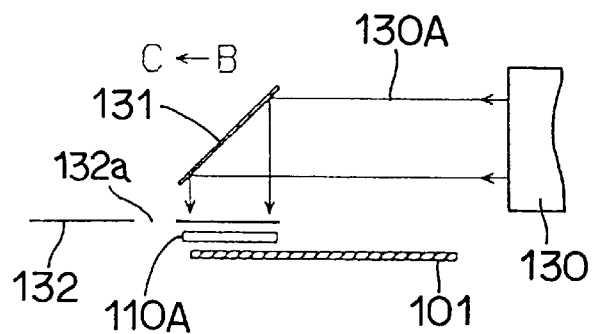

Through the operation hereinbefore, patterns 111 of photomask 110A shown in FIG. 15B are collectively transferred onto the entire surface of glass plate 101. It is noted that glass plate 101 and planar mirror 131 are movable in FIGS. 19A, 19B, 20A, 20B, 21A and 21B. However, as shown in FIGS. 19C, 20C and 21C, for example, patterns 111 of photomask 110A are similarly transferred onto glass plate 101 collectively while moving glass plate 101 and light shielding plate 132 having a prescribed area for irradiation movable, and fixing planar mirror 131. In this case, the area to be irradiated with collimation beam 130A is determined by an opening 132a formed in light shielding plate 132.

Figure 22:
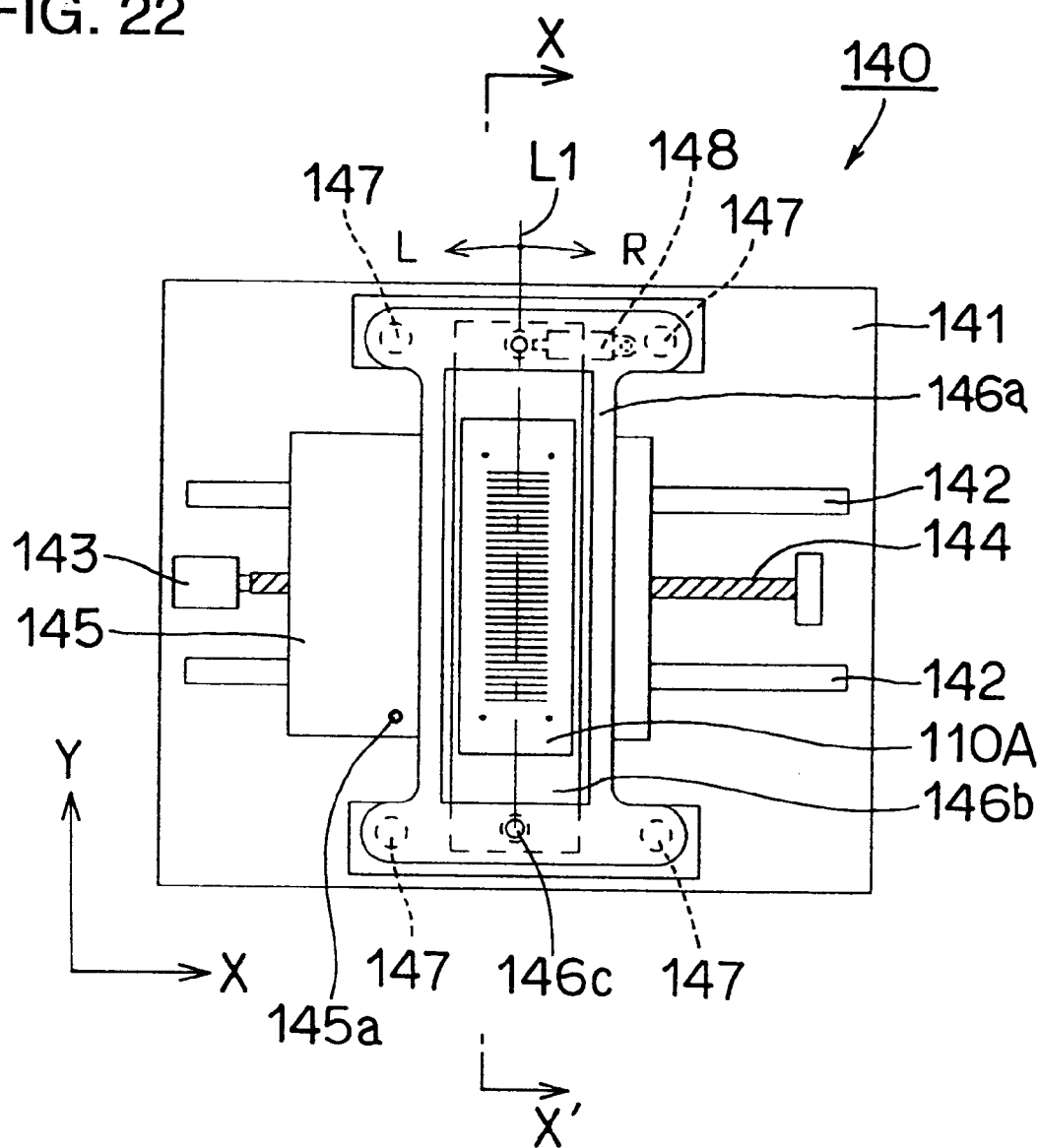
FIGS. 22 and 23 are first and second plan views showing an exposing apparatus for performing the exposing method according to the second embodiment of the present invention.
Figure 23:
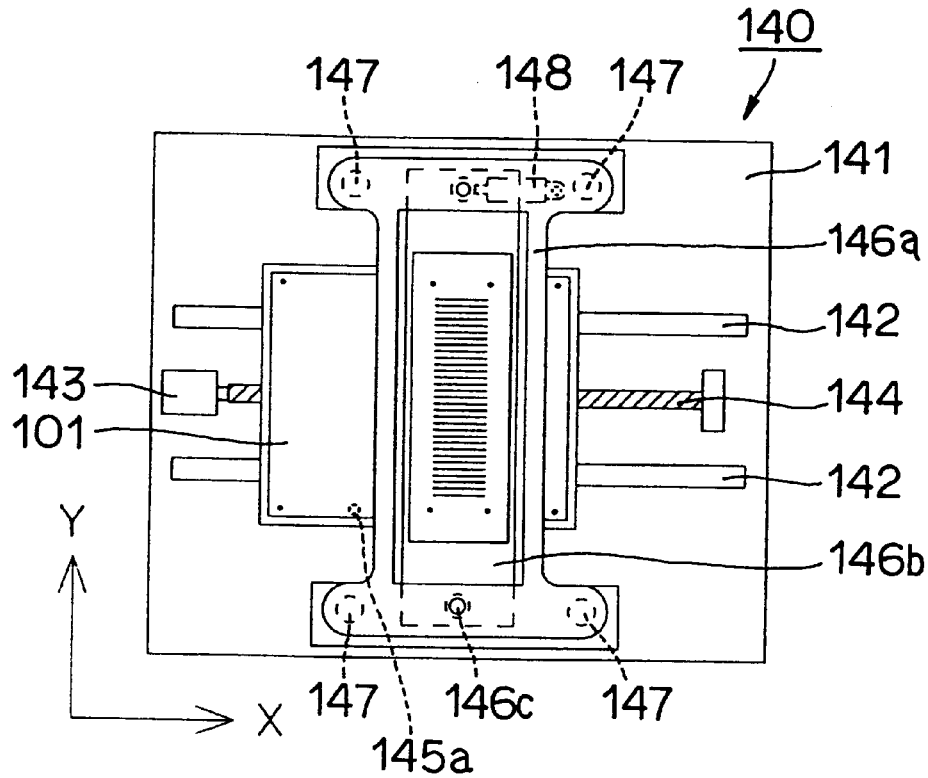
Figure 24:
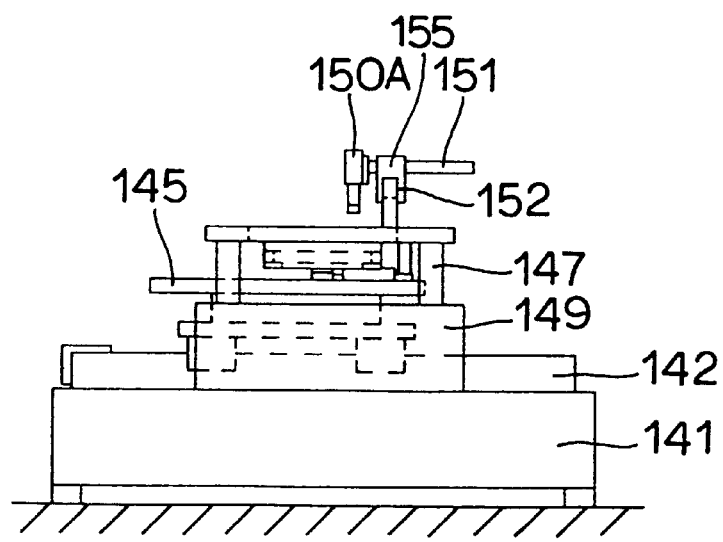
FIG. 24 is a front view showing the exposing apparatus for performing the exposing method according to the second embodiment of the present invention.
Figure 25:
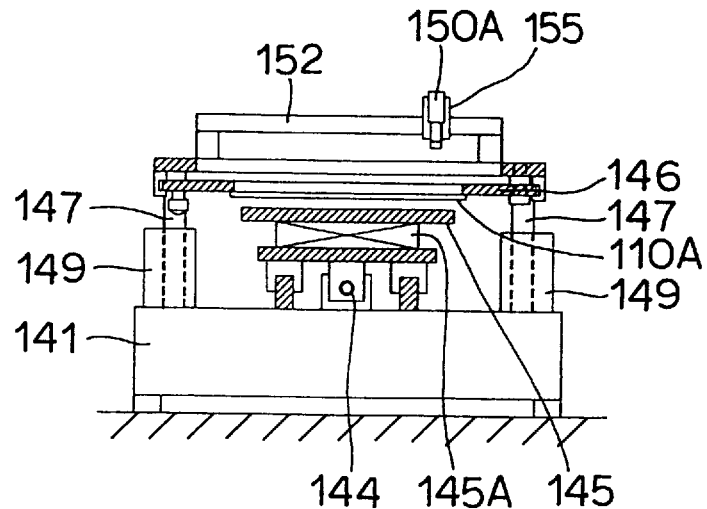
FIG. 25 is a side view showing the exposing apparatus for performing the exposing method according to the second embodiment of the present invention.
Figure 26:
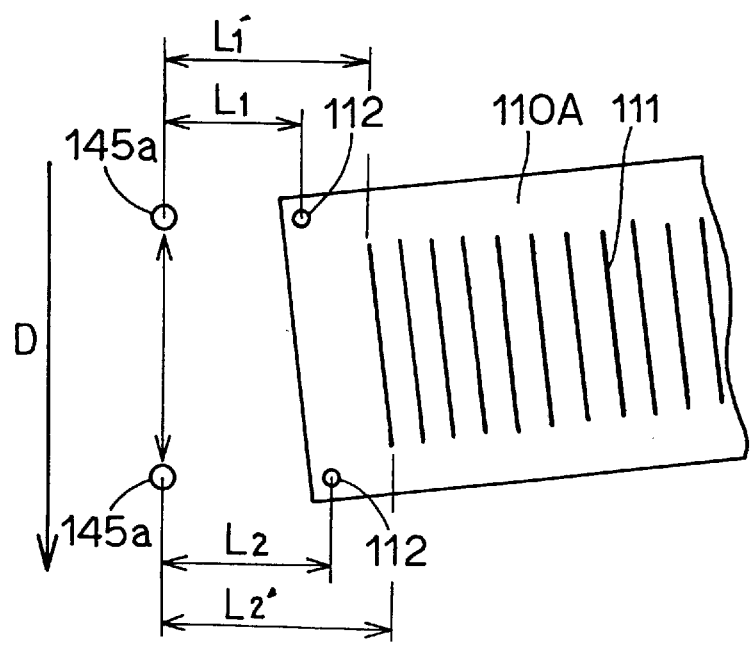
FIG. 26 is a diagram shown in conjunction with alignment of a photomask in a direction of movement of the plate.

Now, a plate moving exposing device including a photomask alignment device for performing the above described method will be described with reference to FIGS. 22 to 26. It is noted that FIGS. 22 and 23 are plan views of a plate moving exposing device 140, and FIGS. 24 and 25 are front and side views thereof, respectively. Further, FIG. 26 is a diagram shown in conjunction with alignment of photomask 110A in the direction in which glass plate 101 moves.

Referring to FIGS. 22 to 25, plate moving exposing device 140 according to the present embodiment is provided with a rails 142 extending in the X direction on a frame 141 with a prescribed distance therebetween. Rails 142 have a plate holder 145 for holding glass plate 101 such that it can be moved in the X direction. A ball screw 144 is provided between frame 141 and plate holder 145 which is driven by a motor 143, so that plate holder 145 moves along rails 142 as ball screw 144 rotates in a prescribed direction.

Plate holder 145 includes an X, Y and θ adjusting mechanism 145A for adjusting a position in the X, Y and θ directions within the surface of glass plate 101. Further, a plate mark 145a is formed for accurately verifying the direction in which plate holder 145 moves.

In the prescribed position above plate holder 145, a mask holder 146b and a mask frame 146a having a mechanism (later described) which slightly moves mask holder 146b in the θ direction are provided.

Mask frame 146a has an elevating unit 149 for elevating or lowering mask frame 146b to adjust a distance between glass plate 101 held by plate holder 145 and photomask 110A held by mask holder 146b, and has an elevating rod 147 controlled by elevating unit 149.

Photomask alignment marks 112 are formed in prescribed positions at four corners of photomask 110A for preliminary aligning photomask 110A with glass plate 101 and verifying if it is moved in parallel to plate holder 145. To adjust the direction in which plate holder 145 moves by using photomask alignment marks 112, mask holder 146b is provided with a rotating shaft 146c at one end such that it can be rotated with respect to mask frame 146a, and with a rotation actuator 148 at the other end for rotating mask holder 146b about rotating shaft 146c in L and R directions in the drawing.

Above photomask 110A, a CCD camera 150A for reading photomask alignment marks 112 formed in photomask 110A and plate mark 145a formed in plate holder 145 is supported by an X direction rod 151 which can be moved in the X direction. Further, X direction rod 151 is movably supported by Y direction rail 152 through a block 155. Y direction rail 152 is secured to mask frame 146.

To adjust photomask 110A such that it is parallel to the direction of movement of plate holder 145, as shown in FIG. 26, distances (L1 and L2 in the drawing) between two photomask alignment marks 112 formed in parallel to linear pattern 111 of photomask 110A and plate marks 145a in the direction of movement (the direction indicated by D in the drawing) of plate holder 145 determined by the movement of plate marks 145a are measured, and mask holder 146b is aligned using a rotating actuator such that L1 equals to L2. It is noted that although photomask alignment marks 112 are used for photomask 110A in aligning mask holder 146b, alignment may be performed by using linear patterns 111 of photomask 110A and measuring distances (see L1' and L2' in FIG. 26) between plate marks 145a and linear patterns 111.

Figure 27:
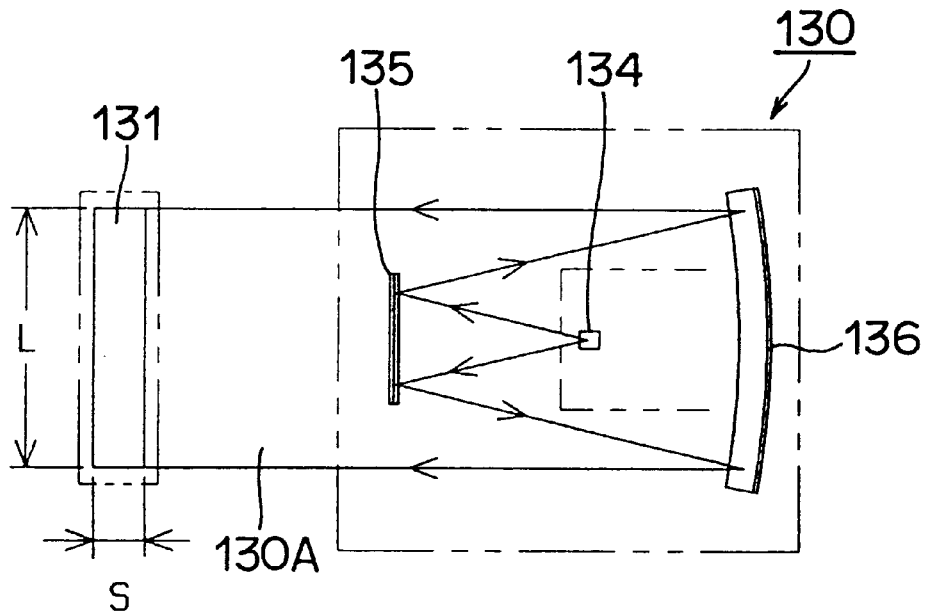
FIG. 27 is a plan view showing a beam generation device according to the second embodiment of the present invention.
Figure 28:
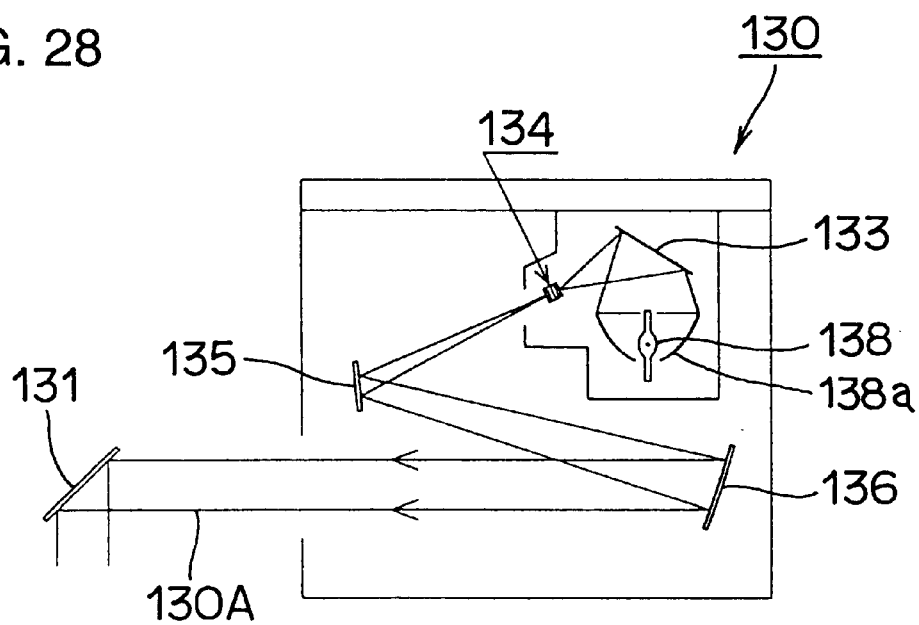
FIG. 28 is a side view showing the beam generation device according to the second embodiment of the present invention.

Now, a collimation beam generation device 130 for directing the above mentioned collimation beam 130A will be described with reference to FIGS. 27 and 28. It is noted that FIGS. 27 and 28 are plan and side views showing collimation beam generation device 130, respectively.

The light directed from a light source 138 is reflected by collection mirror 138a upwardly, changes its travelling direction by planar mirror 133, and is collected by a collection of lenses 134. The light from collection of lenses 134 changes its travelling direction by planar mirror 135, and turns to a collimation beam having a prescribed area for irradiation by a curved mirror 136. Then, the collimation beam is reflected by planar mirror 131 and directed to photomask 110A.

Figure 29:
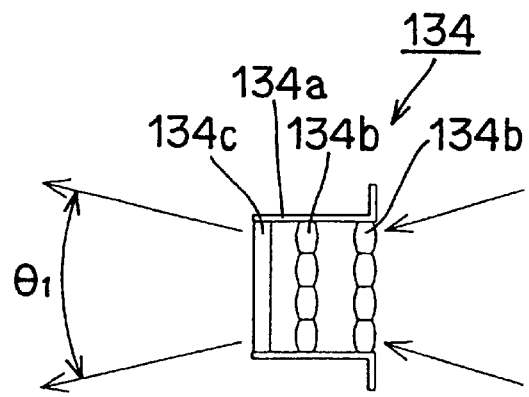
FIG. 29 is a plan view showing a collection of lenses used for the beam generation device according to the second embodiment of the present invention.
Figure 30:
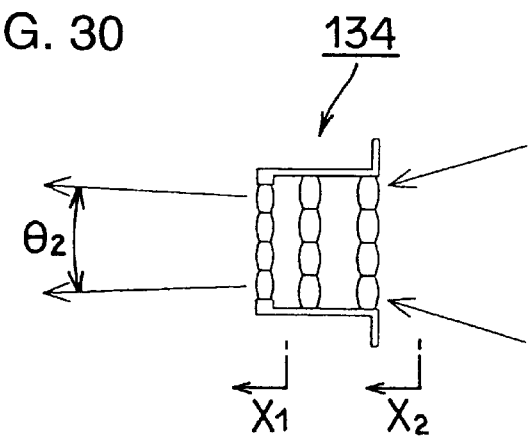
FIG. 30 is a side view showing a collection of lenses used for the beam generation device according to the second embodiment of the present invention.
Figure 31A:
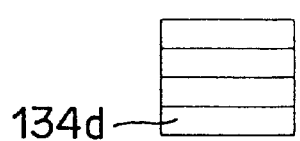
FIGS. 31A and 31B are diagrams respectively showing the collection of lenses shown in FIG. 30 viewed in accordance with arrows $X_1$ and $X_2$.
Figure 31B:
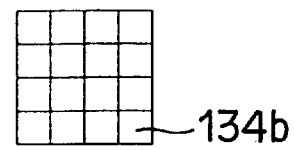

Here, a structure of collection of lenses 134 will be described with reference to FIGS. 29 to 31.

Collection of lenses 134 has a lens supporting member 134a. Two fly eye lenses 134b are arranged in parallel and, on the side of fly eye lens 134b opposite to light source 138, a convex cylindrical lens 134c is arranged. As fly eye lens 134b and convex cylindrical lens 134c are thus combined, the light directed form light source 138 turns to a collimation beam which greatly extends in the plane direction (the direction indicated by θ1 in FIG. 29), but not greatly extends in the side direction (the direction indicated by θ2 in FIG. 30). As a result, the collimation beam with a desired area for irradiation (see a dimension L×S in FIG. 27) can be obtained.

Figure 32:
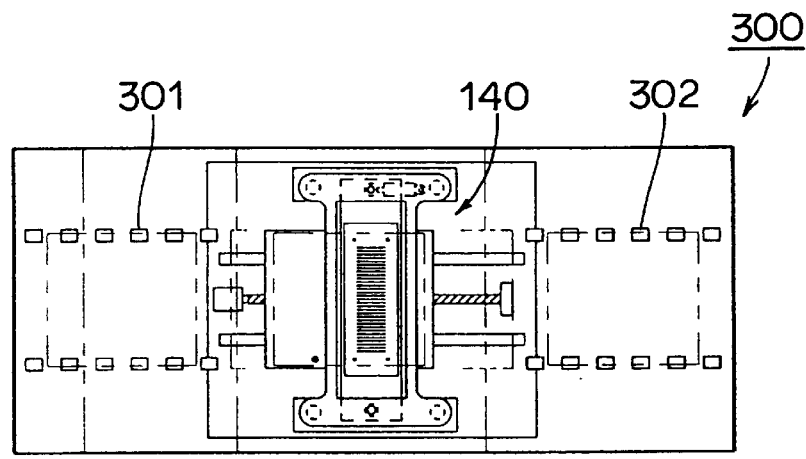
FIG. 32 is a plan view showing the exposing apparatus according to the second embodiment of the present invention.
Figure 33:
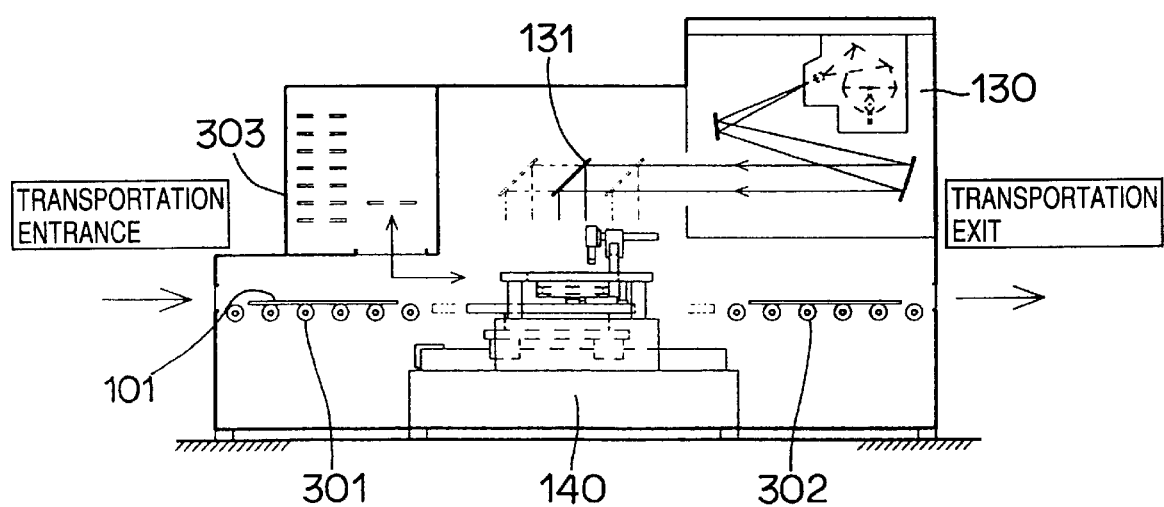
FIG. 33 is a side view showing the exposing apparatus according to the second embodiment of the present invention.

An overall structure of an exposing apparatus 300 including the above described plate moving exposing device and collimation beam generation device 130 will now be described with reference to FIGS. 32 and 33.

On the entrance side of plate moving exposing device 140, an entrance station 301 for carrying glass plate 101 into plate moving exposing device 140 and an exit station 302 for carrying out glass plate 101 for which an exposing process has been performed out of plate moving exposing device 140 are provided.

It is noted that although an carring mechanism for glass plate 101 in entrance and exit stations 301 and 302 are not described in detail, generally, a roller conveyer may be used for transportation, or a transportation mechanism using a plate transportation fork and a plate lift pin may be used as in the first embodiment.

A photomask stoker 303 is provided above entrance station 301 for storing a plurality of photomasks, automatically moving a desired photomask to plate moving exposing device 140 for taking out and storing the photomask in plate moving exposing device 140. It is noted that a part of movement of the photomask may be performed using a glass plate transporting means and a moving mechanism for a plate holder.

In addition, collimation beam generation device 130 is provided above plate moving exposing device 140 and exit station 302. Thus, by providing photomask stoker 303 and collimation beam generation device 130 above plate moving exposing device 140, space required for installing exposing apparatus 300 can be reduced.

As described above, even when exposing apparatus 300 with the above mentioned structure is used, a basic operation similar to that of exposing apparatus 100 in the first embodiment can be performed, and an effect and function as in the case of exposing apparatus 100 can be obtained.

Here, although in each of the above described embodiments, the linear pattern is transferred onto the plate. However, a two or three-dimensionally combined pattern may be formed using an intended material on the plate by combining the steps of: transferring the linear pattern of the photomask onto the plate a plurality of times in a direction which is parallel to or different from the linear pattern of the photomask; forming a photosensitive layer on the plate which is optically negative or positive; and forming a thin layer by development, etching or film formation using the intended material.

Further, by employing a following method, patterns having patterns in grating forms or polygonal patterns can be formed onto the plate.

Figure 34:
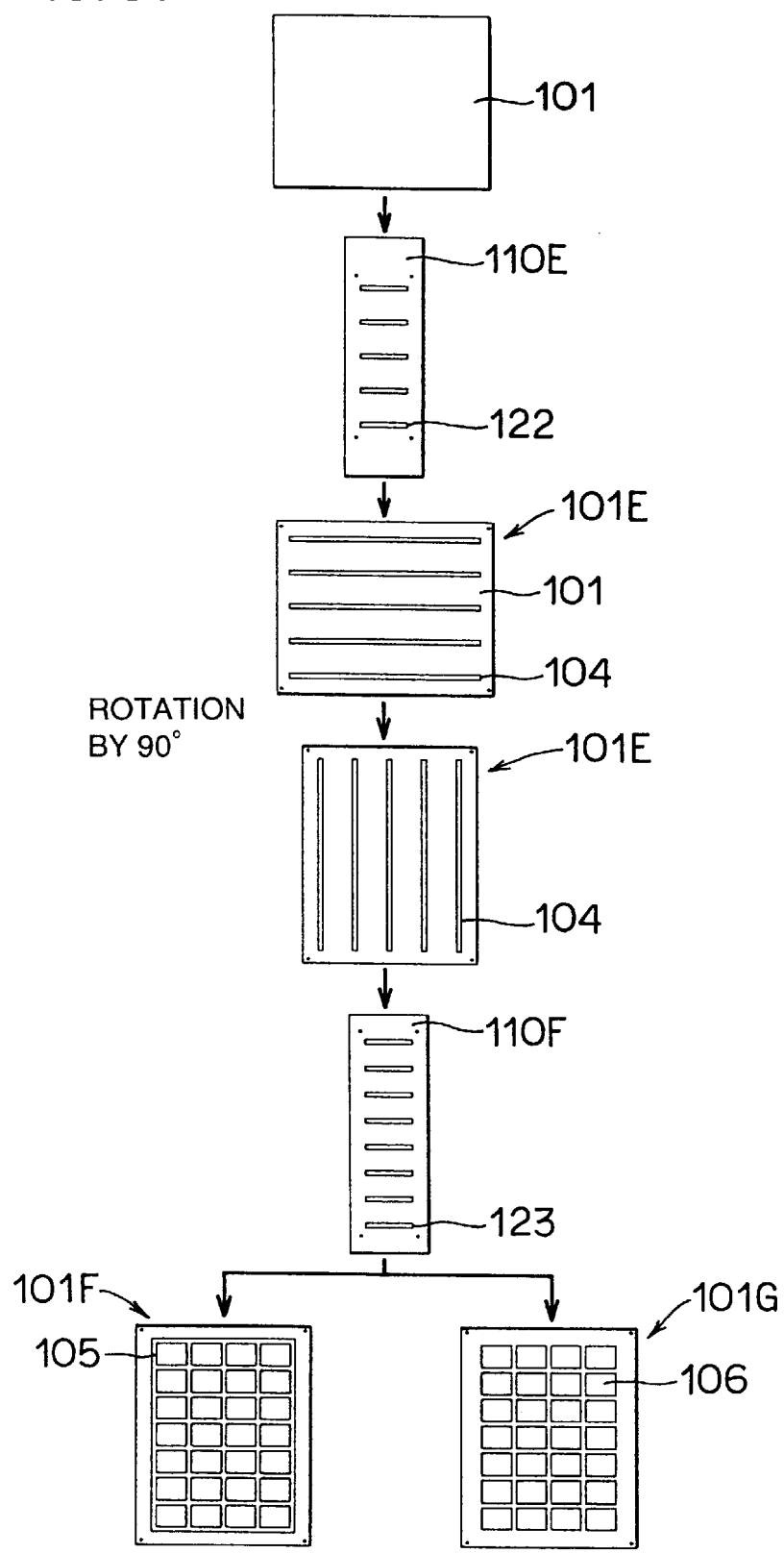
FIG. 34 is a diagram used for describing the exposing method for other patterns 105 and 106 to be transferred onto the glass plate.
Figure 35:
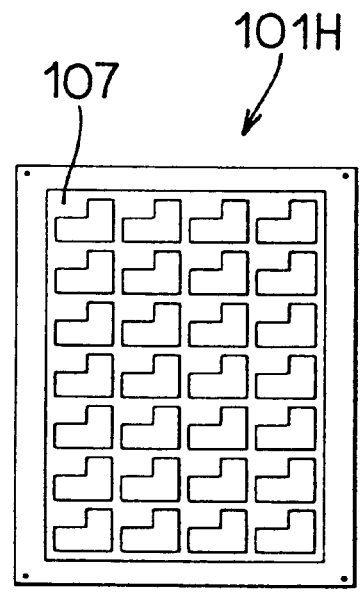
FIG. 35 is a plan view showing another pattern 107 to be transferred onto the glass plate.

Referring to FIG. 34, a plate 101E having a photosensitive layer on which a linear pattern 104 is transferred is formed in accordance with the method described in each of the above embodiments using a photomask 110E having a linear pattern 122 on a photosensitive layer on a glass plate.

Then, plate 10lE is rotated by 90° with respect to the photosensitive layer on which linear pattern 104 is transferred of other photosensitive layer which is further formed after the photosensitive layer on which linear pattern 104 is transferred. Thereafter, the pattern is transferred using a photomask 110F having a linear pattern 123.

In the above described exposing process, a plate 101F having pattern in grating 105 is obtained when a resist film of positive type is used, and glass plate 101G having a plurality of polygonal patterns 106 is obtained when a resist of negative type is used.

Figure 36:
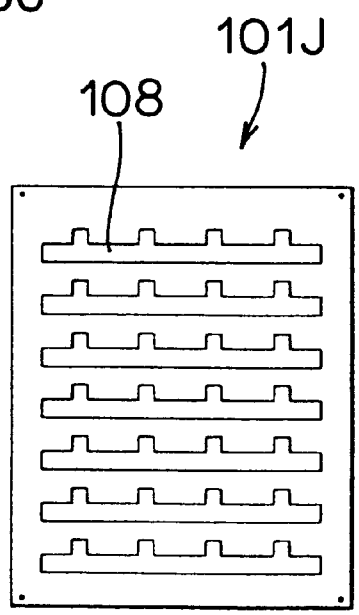
FIG. 36 is a plan view showing another pattern 108 to be transferred onto the glass plate.

In addition, the present invention is not limited to the formation of the above described plate 101F having pattern in grating form 105 and plate 101G having the plurality of polygonal patterns. A plate 101H having a pattern in grating form 107 which is modified as shown in FIG. 36 or a plate 101J having a pattern in stripe form 108 with a protrusion as shown in FIG. 36 can also be formed by employing the steps of: making the transferred pattern onto the first photosensitive layer clear by development; forming a second photosensitive layer onto the first photosensitive layer with the transferred pattern made clear by development; transferring a second linear pattern which is orthogonal to a first linear pattern onto the second photosensitive layer by exposure; and making the transferred pattern on the second photosensitive layer clear by development so that the pattern in grating form of a plurality of polygonal patterns are formed with an intended material.

Further, in each of the above described embodiments, as the pattern is transferred while relatively moving the photomask with respect to the plate, even when a foreign matter or the like adheres on the photomask, it is not transferred onto the plate as the pattern. As a result, the problem associated with a foreign matter or the like on the photomask is eliminated, so that product yield of the plate can be increased.

It is noted that in each of the above described embodiments, the pattern on the photomask has been described only as being transferred onto a layer intended on the glass plate as a linear pattern. The present invention is not limited to this and, for example, patterns in various forms can be transferred onto a layer intended on a glass plate using patterns in rectangular form, stripe form, or other different forms.

The above mentioned embodiments have been described as transferring the linear pattern on the glass plate used for the plasma display. However, the embodiments may also be applied to a printed-circuit board having a linear pattern or to any product to be manufactured by means of an exposing process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposing apparatus for transferring a final pattern onto photosensitive material, the final pattern including parallel lines, comprising:

a plate for supporting the photosensitive material, a photomask defining a transfer pattern, said transfer pattern being provided with a linear portion having a plurality of lines in parallel and an arbitrary portion, a light irradiation device for irradiation of light onto said photosensitive material through said photomask, said photomask and said light irradiation device movable in X and Y directions within an area including said plate, said linear portion on said photomask sequentially and continuously transferred onto the photosensitive material as said photomask is moved with respect to said plate along a moving line, said moving line parallel to the lines transferred onto said photosensitive material, wherein said transfer pattern is defined by the final pattern being divided into arbitrary portions in a direction orthogonal to the parallel lines transferred onto said plate.

2. An exposing apparatus for transferring a final pattern onto a photosensitive material, comprising:

a plate for supporting the photosensitive material, a photomask defining a transfer pattern, said transfer pattern including a linear portion defining parallel lines and at least one arbitrary portion extending from at least one end of said linear portion and defining an arbitrary pattern, a light irradiation device for irradiation of light onto said plate through said photomask, and a plate holder holding said plate, said plate holder movable in a moving line parallel to the parallel lines transferred onto the photosensitive material, said plate positionable relative to said light irradiation device and said photomask in at least two modes:

in a first mode, said arbitrary pattern of said arbitrary portion being transferred onto the photosensitive material by irradiation of light through said arbitrary portion of said photomask while said plate fixed with respect to said arbitrary portion of said photomask, and in a second mode, said linear lines of said linear portion being transferred onto the photosensitive material by irradiation of light through said linear portion of said photomask while said linear portion and said light irradiation device synchronously moving with respect to said plate along said moving line, whereby in said second mode a total pattern of parallel lines are transferred onto the photosensitive material, the parallel lines of the total pattern having a length greater than the length of the parallel lines transferred onto the photosensitive material during said first mode.

3. The exposing apparatus according to claim 2, wherein said transfer pattern is defined by the final pattern being divided into arbitrary portions in a direction orthogonal to the parallel lines transferred onto said plate.

4. The exposing apparatus according to claim 2, wherein light is directed to said transfer pattern on said photomask and through said photomask to form an image on said plate by means of an optical system provided between said photomask and said plate.

5. The exposing apparatus according to claim 2, further comprising a photomask moving device for moving said photomask, wherein said light irradiation device is positioned above said photomask moving device and moves together with said photomask.

6. The exposing apparatus according to claim 5, further comprising a reflection mirror, wherein said light irradiation device is positioned outside said photomask moving device, and collimation beams emanated from said light irradiation device are deflected by said reflection mirror to reach said photomask and said plate.

7. The exposing apparatus according to claim 6, further comprising:
   an entrance conveyer having a entrance conveyer top surface for carrying said plate from an entrance to a position for exposure, and
   an exit conveyer having a exit conveyer top surface for carrying said plate from said position for exposure to an exit, wherein said light irradiation device is positioned above said top surfaces.

8. The exposing apparatus according to claim 2, wherein a light source of said light irradiation device is laser light.

9. The exposing apparatus according to claim 2, wherein said photomask includes a photomask alignment mark for alignment with said plate.

10. The exposing apparatus according to claim 2, wherein said photomask further includes a photomask alignment mechanism for alignment of said photomask with said plate in X, Y and θ directions.

11. The exposing apparatus according to claim 10, further comprising a plate holder for holding said plate, said plate holder having an alignment mechanism for alignment of said photomask with said photomask alignment mechanism in said X, Y and θ directions.

12. The exposing apparatus according to claim 2, wherein said photomask and said plate are movable relative to each other in X and Y directions, said photomask moving in both said X and Y directions and said plate being fixed.

13. The exposing apparatus according to claim 2, wherein said photomask and said plate are movable relative to each other in X and Y directions, with photomask movable in one of said X and Y directions and with said plate movable in an other of said X and Y directions.

14. The exposing apparatus according to claim 2, further comprising a clearance measuring device and a clearance adjusting device for maintaining a clearance between said photomask and said plate.

15. An exposing apparatus according to claim 2, further comprising a mechanism for changing a size of an area of said plate to be irradiated with light.

16. The exposing apparatus according to claim 2, wherein:
   an area to be irradiated with light on said photomask by is in an rectangular form determined by at least one of an optical system of a light source directing said light and a shielding plate having a light transmission window, and
   a length of a side of said area to be irradiated with light in parallel to the parallel lines of said linear portions of said photomask is shorter than said parallel lines.

17. The exposing apparatus according to claim 2, wherein said photomask include:
   slightly moving means for moving in a θ direction on a plane including a surface thereof; and
   controlling means for controlling said slightly moving means such movement said plate holder is along said moving line by moving said plate holder and measuring a distance in a direction which is orthogonal to said linear portion of said photomask between one of two photomask alignment marks provided parallel to said linear portion of said photomask and with a distance therebetween and said linear portion of said photomask, and one plate holder alignment mark provided in said plate holder which is guided by a straight rail and moves in parallel to said linear portion of said photomask.

18. The exposing apparatus according to claim 2, further comprising alignment controlling means for aligning said photomask with said plate by simultaneously reading a plurality of photomask alignment marks of said photomask and a plate alignment mark corresponding to said photomask alignment marks and, based on an amount of displacement in position of said photomask alignment marks and said plate alignment marks, further moving said plate in X, Y and θ directions for alignment of said photomask and said plate, in a state in which each of said photomask alignment marks of said photomask and said plate alignment marks are aligned by moving said plate with respect to said photomask.

19. An exposing method of transferring a final pattern onto a photosensitive material using an exposing apparatus having a plate, a photomask, and a light irradiation device, the plate for supporting the photosensitive material, the photomask for defining a transfer pattern, and the light irradiation device for irradiation of light onto the plate through the photomask, the transfer pattern including a linear portion defining parallel lines and at least one arbitrary portion extending from an end of the linear portion, comprising the steps of:
   irradiating light through the linear portion and at least one arbitrary portion to transfer the linear portion and at least one arbitrary portion onto the photosensitive material, the plate being stationary relative to the photomask during said step of irradiating light through the linear portion and at least one arbitrary portion; and,
   irradiating light through only the linear portion to lengthen the parallel lines transferred onto the photosensitive material during said first irradiating step, said second irradiation step concurrent with
   displacing the linear portion and the light irradiation device synchronously with one another along a movement line relative to the plate, the movement line being parallel to the parallel lines transferred onto the photosensitive material, whereby a length of the parallel lines transferred onto the photosensitive material after both said irradiating steps is greater than the length of the parallel lines transferred onto the photosensitive material after said first irradiating step.

20. An exposing method according to claim 19, further comprising the step of moving the photomask and the light irradiation device relative to the plate in a direction orthogonal to the movement line and repeating said irradiating steps and said displacing step to form the final pattern in grating form.

21. The exposing method according to claim 20, wherein the transfer pattern is defined by the final pattern being divided into arbitrary portions in a direction orthogonal to the parallel lines transferred onto the plate.

22. An exposing method according to claim 19, further comprising the steps of:

transferring said linear portions of said photomask onto said plate a plurality of times from said linear patterns of said photomask in different locations;

forming a photosensitive layer on said plate; and forming thin film with other material.

23. An exposing method according to claim 19, further comprises the steps of:

making the final pattern on the photosensitive layer clear by development; and forming a second final pattern by:

forming a second photosensitive layer on said first photosensitive layer, transferring a second linear pattern orthogonal to said first linear pattern onto said second photosensitive layer, and making the second final pattern on said second photosensitive layer clear by development.

* * * * *